US010856445B2

(12) United States Patent
Murakami et al.

(10) Patent No.: US 10,856,445 B2
(45) Date of Patent: *Dec. 1, 2020

(54) ELECTRONIC COMPONENT HOUSING APPARATUS AND ELECTRONIC DEVICE

(71) Applicant: NEC Network and Sensor Systems, Ltd., Fuchu (JP)

(72) Inventors: Masahiro Murakami, Tokyo (JP); Norio Masuda, Tokyo (JP)

(73) Assignee: NEC NETWORK AND SENSOR SYSTEMS, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/662,479

(22) Filed: Oct. 24, 2019

(65) Prior Publication Data

US 2020/0060046 A1 Feb. 20, 2020

Related U.S. Application Data

(62) Division of application No. 15/772,914, filed as application No. PCT/JP2016/085669 on Dec. 1, 2016, now Pat. No. 10,506,742.

(30) Foreign Application Priority Data

Dec. 2, 2015 (JP) ................. 2015-235363

(51) Int. Cl.
*H05K 7/20* (2006.01)
*H05K 5/02* (2006.01)
*H05K 5/04* (2006.01)

(52) U.S. Cl.
CPC ....... *H05K 7/20445* (2013.01); *H05K 5/0217* (2013.01); *H05K 7/20* (2013.01);
(Continued)

(58) Field of Classification Search
CPC .. H05K 7/20445; H05K 7/20; H05K 7/20909; H05K 7/209; H05K 7/20145;
(Continued)

(56) References Cited

U.S. PATENT DOCUMENTS

| 5,831,847 A | 11/1998 | Love |
| 5,905,647 A | 5/1999 | Shirai |

(Continued)

FOREIGN PATENT DOCUMENTS

| CN | 103370515 A | 10/2013 |
| CN | 104704934 A | 6/2015 |

(Continued)

OTHER PUBLICATIONS

Extended European Search Report for EP Application No. EP16870751.1 dated Jul. 30, 2019.

(Continued)

*Primary Examiner* — Stephen S Sul

(57) ABSTRACT

To provide an electronic component housing apparatus that is able to efficiently cool the heat of a first and second electronic component, a first electronic component housing chamber 5000 houses the high voltage power supply module 100 (the first electronic component). A second electronic component housing chamber 6000 houses the TWT 200 (the second electronic component). At least some of a first partition plate 2500 and a second partition plate 2600 are provided so as to face each other. A first gap part G1 is provided between the first partition plate 2500 and the second partition plate 2600.

4 Claims, 14 Drawing Sheets

(52) U.S. Cl.
CPC ......... *H05K 7/209* (2013.01); *H05K 7/20145* (2013.01); *H05K 7/20909* (2013.01); *H05K 5/023* (2013.01); *H05K 5/04* (2013.01); *H05K 7/20172* (2013.01)

(58) Field of Classification Search
CPC .... H05K 5/0217; H05K 7/20172; H05K 5/04; H05K 5/023; H05K 7/2039
USPC ................................ 361/690, 694, 695, 709
See application file for complete search history.

(56) References Cited

U.S. PATENT DOCUMENTS

| | | | |
|---|---|---|---|
| 6,618,248 B1* | 9/2003 | Dalheimer | G06F 1/18 312/223.1 |
| 8,045,327 B2* | 10/2011 | Tomioka | H05K 7/20518 165/104.33 |
| 9,820,407 B2* | 11/2017 | Sakamoto | G06F 1/20 |
| 10,506,742 B2* | 12/2019 | Murakami | H05K 5/0217 |
| 2003/0168985 A1 | 9/2003 | Watkins et al. | |
| 2005/0259403 A1 | 11/2005 | Sonoda | |
| 2007/0211435 A1 | 9/2007 | Ganev et al. | |
| 2008/0030951 A1* | 2/2008 | Hall | H05K 7/20918 361/696 |
| 2008/0037219 A1 | 2/2008 | Chen et al. | |
| 2008/0144279 A1 | 6/2008 | Yamamoto et al. | |
| 2009/0141447 A1 | 6/2009 | Soma et al. | |
| 2010/0039771 A1* | 2/2010 | Marchand | H05K 7/20909 361/694 |
| 2010/0110631 A1* | 5/2010 | Fong | H05K 5/063 361/695 |
| 2010/0321887 A1 | 12/2010 | Kwon et al. | |
| 2013/0027887 A1* | 1/2013 | Osato | H05K 7/20909 361/709 |
| 2013/0094140 A1 | 4/2013 | Yen et al. | |
| 2013/0314872 A1 | 11/2013 | Kawakita et al. | |
| 2014/0340846 A1 | 11/2014 | Kurita et al. | |
| 2015/0062812 A1 | 3/2015 | Hwang | |
| 2015/0153792 A1 | 6/2015 | Chen | |
| 2015/0216077 A1* | 7/2015 | Tanaka | H02M 7/003 361/697 |
| 2015/0216090 A1 | 7/2015 | Sakuma et al. | |
| 2015/0349714 A1 | 12/2015 | Wright | |

FOREIGN PATENT DOCUMENTS

| | | |
|---|---|---|
| CN | 206195593 U | 5/2017 |
| JP | H04-163077 A | 6/1992 |
| JP | 2004-140036 A | 5/2004 |
| JP | 2004-179308 A | 6/2004 |
| JP | 2005-519448 A | 6/2005 |
| JP | 2008-211001 A | 9/2008 |
| JP | 2008-253073 A | 10/2008 |
| JP | 2011-151133 A | 8/2011 |
| JP | 2012-127532 A | 7/2012 |
| JP | 2012-141069 A | 7/2012 |
| JP | 2014-225573 A | 12/2014 |
| WO | 2014/147963 A1 | 9/2014 |

OTHER PUBLICATIONS

Chinese Office Action for CN Application No. 201680070834.7 dated Jun. 24, 2019 with English Translation.
International Search Report for PCT Application No. PCT/JP2016/085669, dated Feb. 21, 2017.
English translation of Written opinion for PCT Application No. PCT/JP2016/085669.
Tanaka, Wataru, "Electronic Circuit Module", May 13, 2004, Matsushita Electric Works LTD, Entire Document (Translation of JP 2004140036—of record, cited in IDS, including Original Document). (Year 2004).
Sakuma, Masaki, "Cooling Device and Power Converter Having Cooling Device", Feb. 16, 2017, Fuji Electric Co LTD, Entire Document (Translation of WO 2014147963—of record, cited in IDS, including Original Document). (Year : 2017).

* cited by examiner

A – A

B - B

D - D

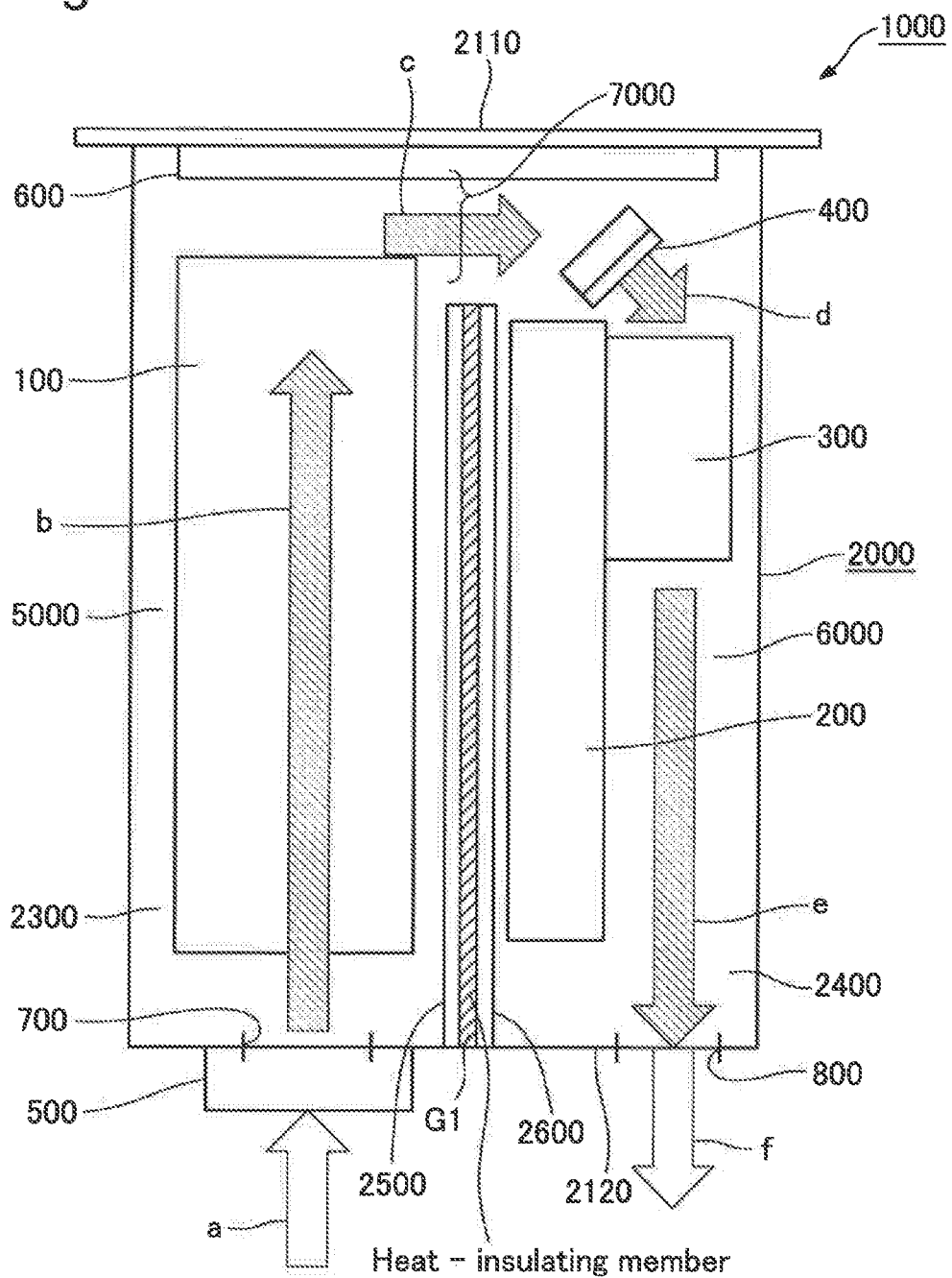

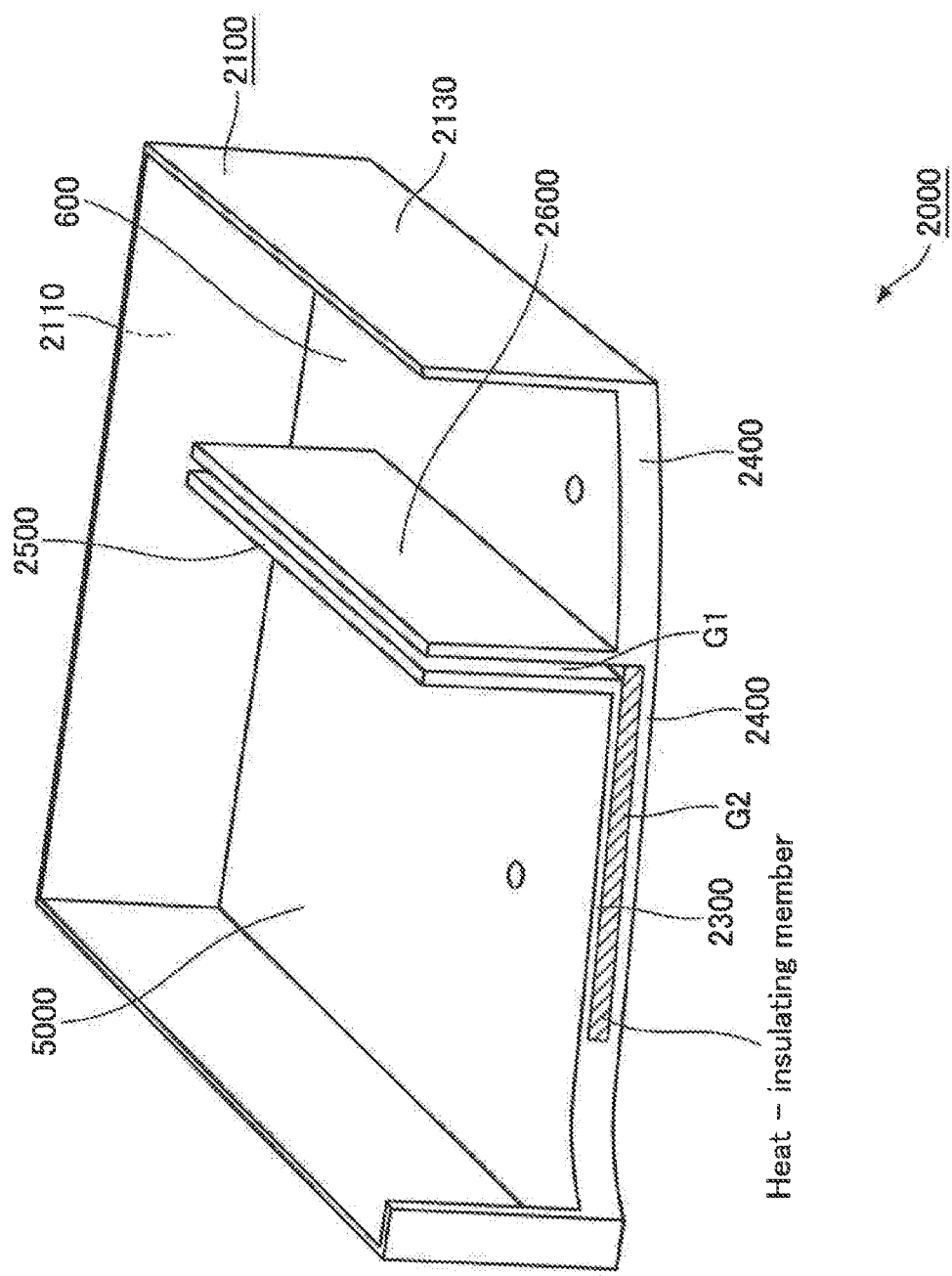

ELECTRONIC COMPONENT HOUSING APPARATUS AND ELECTRONIC DEVICE

REFERENCE TO RELATED APPLICATION

This present application is a Divisional Application of Ser. No. 15/772,914 filed on May 2, 2018, which is a National Stage Entry of International Application PCT/JP2016/085669 filed on Dec. 1, 2016, which claims the benefit of priority from Japanese Patent Application 2015-235363 filed on Dec. 2, 2015, the disclosures of all of which are incorporated in their entirety by reference herein.

TECHNICAL FIELD

The present invention relates to an electronic component housing apparatus and the like and, for example, relates to an electronic component housing apparatus and the like housing a heat-generating electronic component.

BACKGROUND ART

A microwave power module (MPM) is an amplifier module used in microwave band communication. A common microwave power module includes a traveling wave tube (TWT) and an electronic power conditioner (EPC). The EPC is also called a high-voltage power supply module.

The TWT outputs electric power ranging from several tens of watts (W) to several kilowatts (kW). Accordingly, the TWT generates high-temperature heat as a heating element.

A technology of radiating heat of a heating element such as a TWT is disclosed in, for example, PTLs 1 and 2.

PTL 1 discloses a technology of radiating heat of a heating element (electrode structure) by use of a heat sink. In the technology described in PTL 1, a heat sink receives heat of a heating element through an electrically insulating member. Then, the heat sink radiates the received heat. Thus, the technology described in PTL 1 is able to inhibit a temperature rise of a heating element by radiating heat of the heating element by a heat sink.

PTL 2 discloses a technology of radiating heat of a heating element (an electronic component having a large heat quantity, such as a power amplifier unit and a power supply unit) in such a way that heat of the heating element does not influence another module (an electronic component having a small heat quantity). In the technology described in PTL 2, a partition plate is provided between a high-heat-generating module housing part housing a heating element and a low-heat-generating module housing part housing another module. Influence of heat of the heating element on the other module is reduced by providing the partition plate. Consequently, a temperature rise of the other module can be inhibited.

Related arts of the present invention are also disclosed in PTLs 3 and 4.

CITATION LIST

Patent Literature

[PTL 1] Japanese Translation of PCT International Application Publication No. 2005-519448
[PTL 2] Japanese Unexamined Patent Application Publication No. 2004-179308
[PTL 3] Japanese Unexamined Patent Application Publication No. 2012-127532
[PTL 4] Japanese Unexamined Patent Application Publication No. 2012-141069

SUMMARY OF INVENTION

Technical Problem

However, in the technologies described in PTLs 1 and 2, a case housing a heating element may function as a heat conductor. In this case, there is a problem that an electronic component having a small heat quantity may be subjected to heat of an electronic component having a large heat quantity through the case.

Metal (e.g. aluminum and iron) is widely used as a material of a case of a common microwave power module for a reason of high processability and high strength. Since metal has high heat conductivity, a case itself may become a heat conduction path. Accordingly, a possibility of an electronic component having a small heat quantity being subjected to heat of an electronic component having a large heat quantity through a case is particularly increased in a microwave power module.

Further, although the technology described in PTL 2 reduces influence of heat of a heating element on another module by providing a partition plate, the other module housed in a low-heat-generating module housing part may become subjected to heat of the heating element housed in a high-heat-generating module housing part through the partition plate.

The present invention has been made in view of such a situation, and an object of the present invention is to provide an electronic component housing apparatus and the like capable of efficiently cooling heat of a second electronic component having a heat quantity greater than that of a first electronic component while inhibiting an incidence of the first electronic component being subjected to heat of the second heat electronic component.

Solution to Problem

An electronic component housing apparatus according to the present invention includes:
a case housing a first electronic component and a second electronic component having a heat quantity greater than that of the first electronic component;
a first electronic component housing chamber housing the first electronic component;
a second electronic component housing chamber housing the second electronic component;
a first partition plate arranged between the first electronic component housing chamber and the second electronic component housing chamber, on the first electronic component housing chamber side; and
a second partition plate arranged between the first electronic component housing chamber and the second electronic component housing chamber, on the second electronic component housing chamber side, wherein
the first partition plate and a second partition plate are provided in such a way as to at least partially face each other, and
a first gap part is provided between the first partition plate and a second partition plate.

An electronic device according to the present invention includes:
a first electronic component;
a second electronic component having a heat quantity greater than that of the first electronic component;

a case housing a first electronic component and a second electronic component;

a first electronic component housing chamber housing the first electronic component;

a second electronic component housing chamber housing the second electronic component;

a first partition plate arranged between the first electronic component housing chamber and the second electronic component housing chamber, on the first electronic component housing chamber side; and a second partition plate arranged between the first electronic component housing chamber and the second electronic component housing chamber, on the second electronic component housing chamber side, wherein the first partition plate and a second partition plate are provided in such a way as to at least partially face each other, and a first gap part is provided between the first partition plate and a second partition plate.

Advantageous Effects of Invention

An electronic component housing apparatus and the like according to the present invention are able to efficiently cool heat of a second electronic component having a heat quantity greater than that of a first electronic component while inhibiting an incidence of the first electronic component being subjected to heat of the second electronic component.

BRIEF DESCRIPTION OF DRAWINGS

FIG. 7a is a top view illustrating the heat radiation simulation result of the electronic device according to the second exemplary embodiment of the present invention. FIG. 7b is a cross-sectional view illustrating the heat radiation simulation result of the electronic device according to the second exemplary embodiment of the present invention and is a cross-sectional view at an A-A section in FIG. 7a.

FIG. 8a is a top view illustrating the heat radiation simulation result of the comparative example of the electronic device according to the second exemplary embodiment of the present invention. FIG. 8b is a cross-sectional view illustrating the heat radiation simulation result of the comparative example of the electronic device according to the second exemplary embodiment of the present invention and is a cross-sectional view at a B-B section in FIG. 8a.

FIG. 9a is a top view illustrating the heat radiation simulation result of the electronic device according to the second exemplary embodiment of the present invention. FIG. 9b is a cross-sectional view illustrating the heat radiation simulation result of the electronic device according to the second exemplary embodiment of the present invention and is a cross-sectional view at a C-C section in FIG. 9a.

FIG. 10a is a top view illustrating the heat radiation simulation result of the modified example of the electronic device according to the second exemplary embodiment of the present invention. FIG. 10b is a cross-sectional view illustrating the heat radiation simulation result of the modified example of the electronic device according to the second exemplary embodiment of the present invention and is a cross-sectional view at a D-D section in FIG. 10a.

FIG. 13 is a diagram showing an example in which a heat-insulating member is added to the electronic device according to the first embodiment of the present invention.

FIG. 14 is a diagram showing an example in which a heat-insulating member is added to the electronic device according to the second embodiment of the present invention.

DESCRIPTION OF EMBODIMENTS

First Exemplary Embodiment

Figure 1:
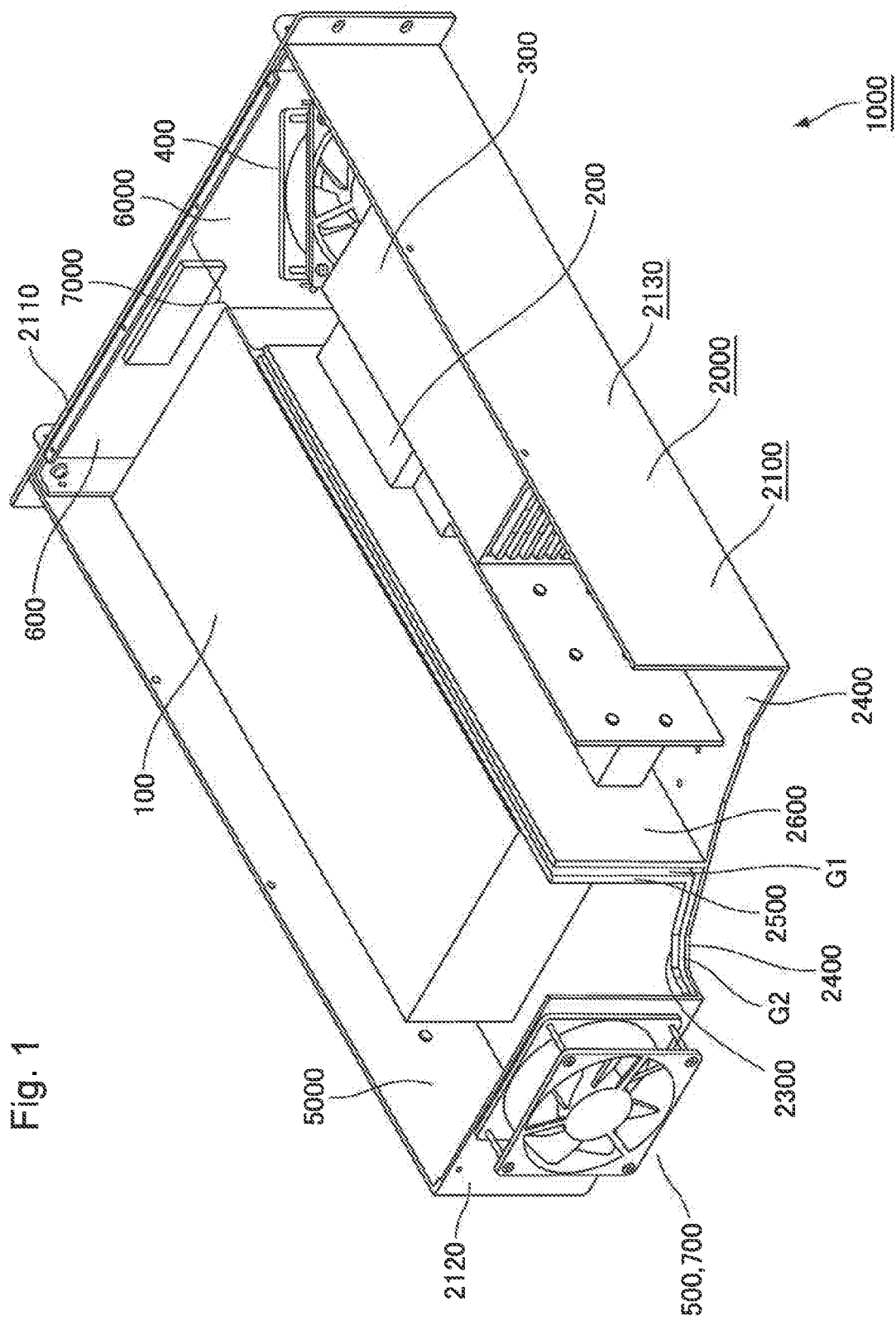
FIG. 1 is a perspective view illustrating an internal configuration of an electronic device according to a first exemplary embodiment of the present invention.
Figure 2:
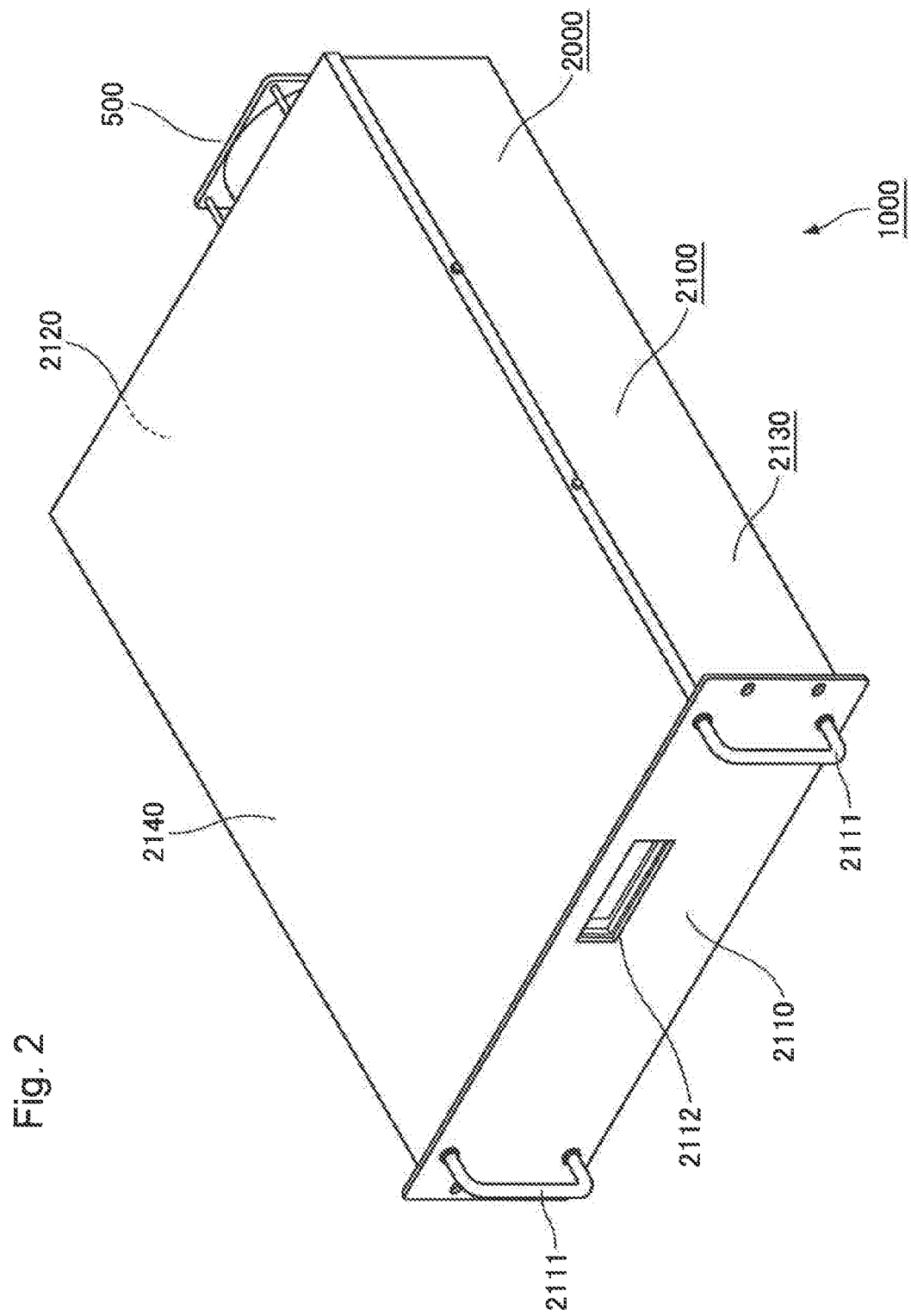
FIG. 2 is a perspective view of an external appearance of the electronic device according to the first exemplary embodiment of the present invention viewed from the front side.
Figure 3:
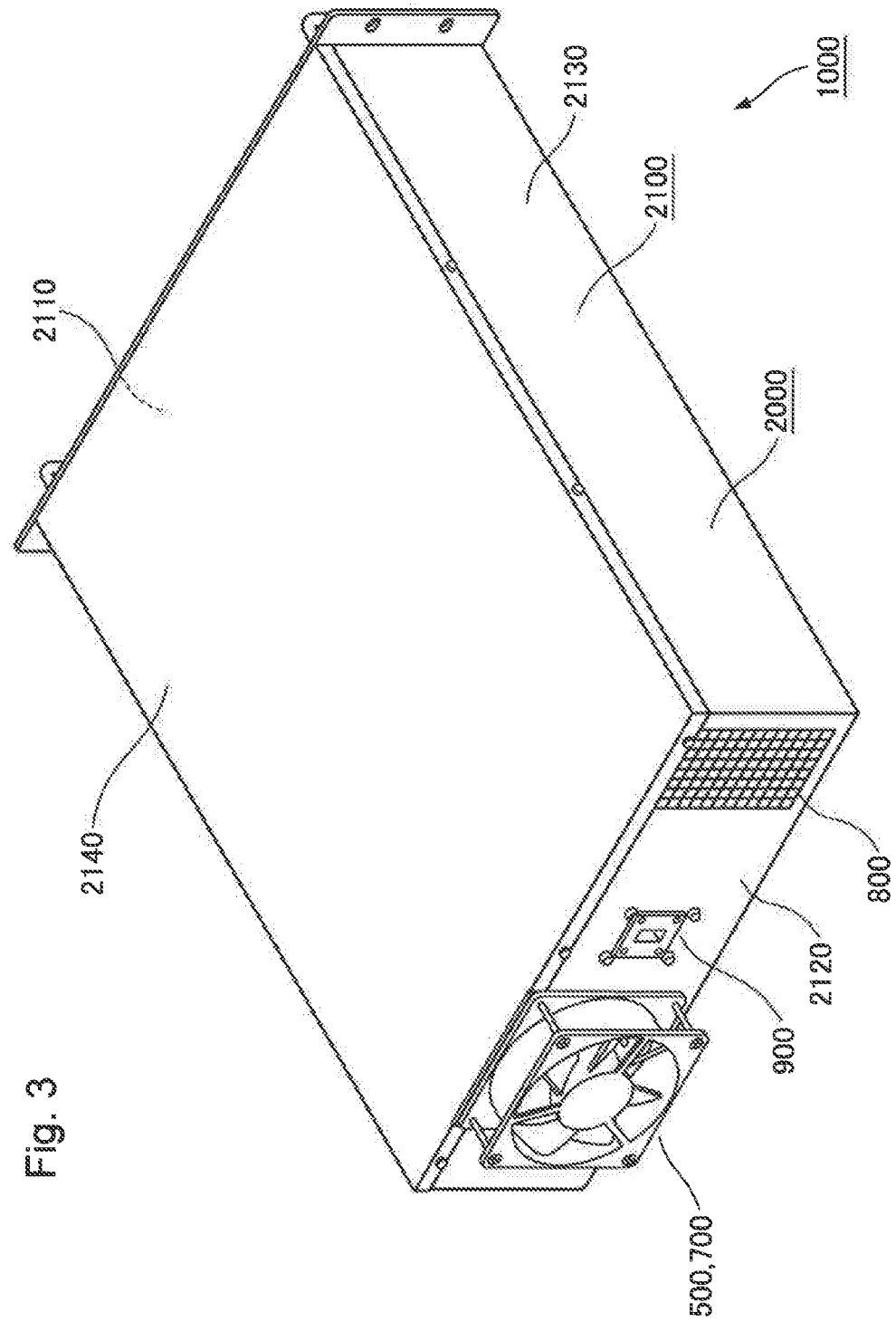
FIG. 3 is a perspective view of an external appearance of the electronic device according to the first exemplary embodiment of the present invention viewed from the back side.
Figure 4:
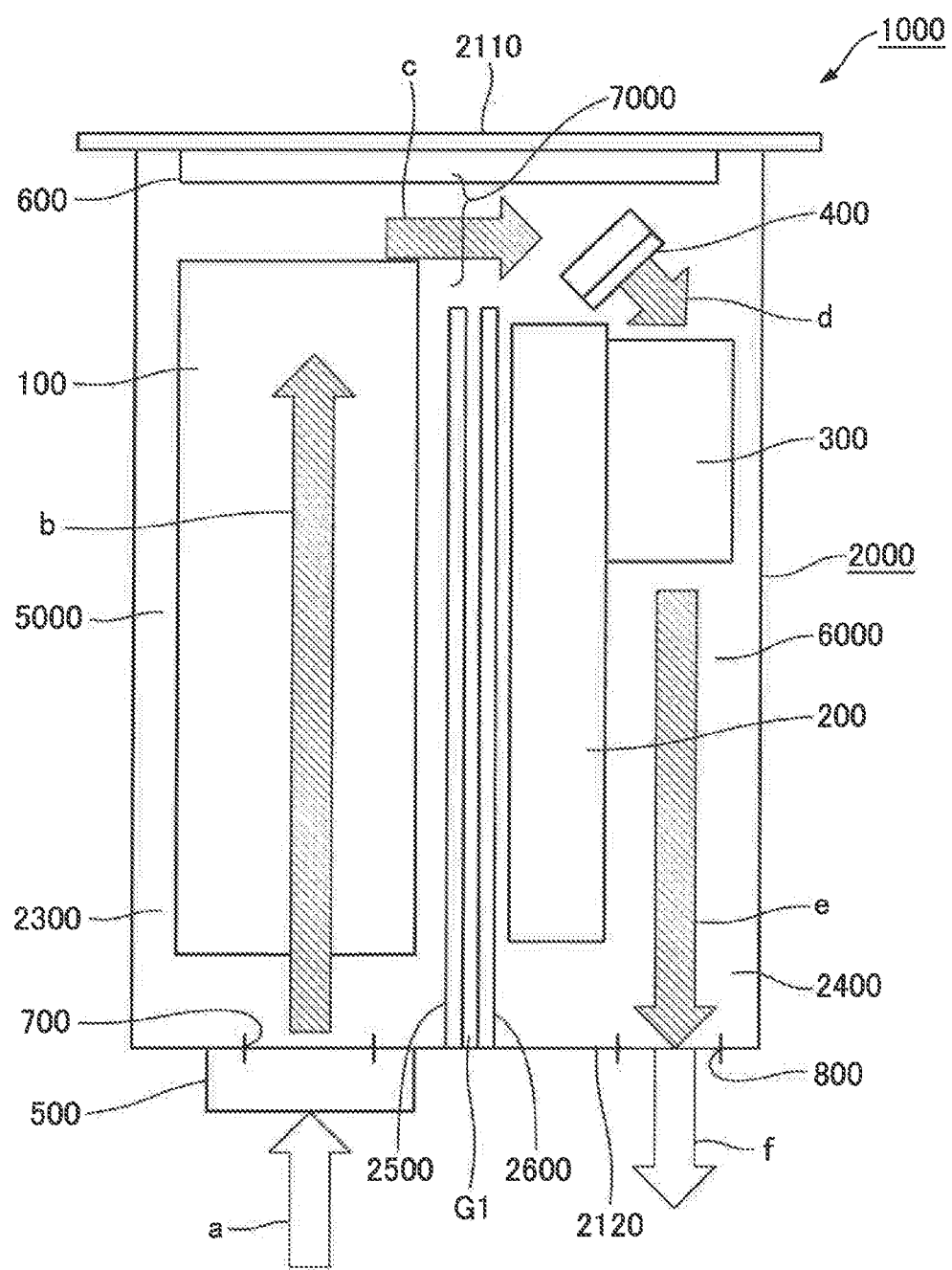
FIG. 4 is a top view illustrating an internal configuration of the electronic device according to the first exemplary embodiment of the present invention.
Figure 5:
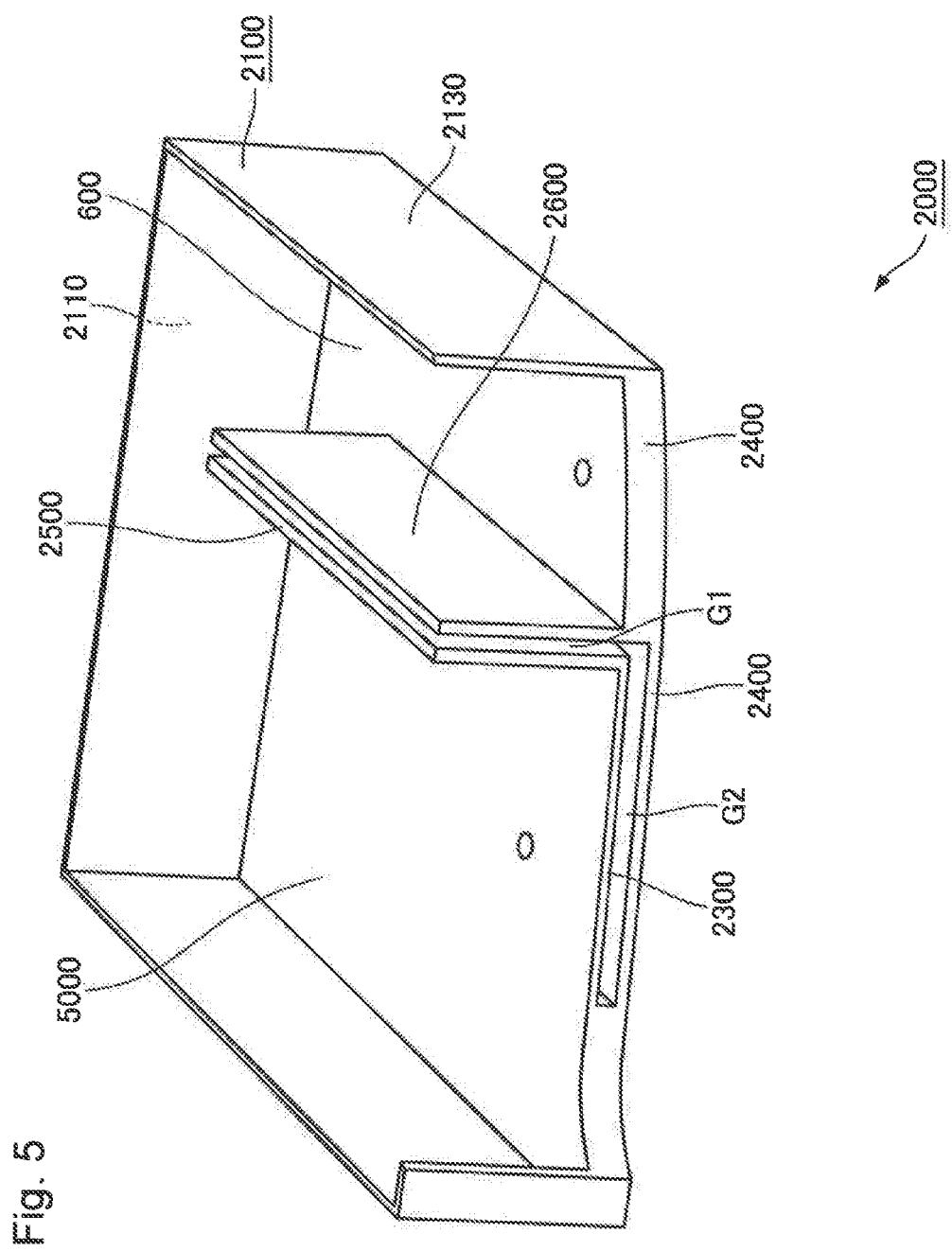
FIG. 5 is a perspective view illustrating an internal configuration of an electronic component housing apparatus according to the first exemplary embodiment of the present invention.

A configuration of an electronic device 1000 according to a first exemplary embodiment of the present invention will be described. FIG. 1 is a perspective view illustrating an internal configuration of the electronic device 1000. FIG. 2 is a perspective view of an external appearance of the electronic device 1000 viewed from the front side. FIG. 3 is a perspective view of an external appearance of the electronic device 1000 viewed from the back side. FIG. 4 is a top view illustrating an internal configuration of the electronic device 1000. FIG. 5 is a perspective view illustrating an internal configuration of an electronic component housing apparatus 2000.

For example, the electronic device 1000 is a microwave power module. The microwave power module is a relatively new module and has both of an advantage of being high-power and highly efficient exerted by a TWT, and an advantage of being small-sized, high-gain, and low-noise exerted by a solid state amplifier (SSA). In the following description, the electronic device 1000 will be described as a microwave power module. For example, the electronic device 1000 is equipped on a satellite communication apparatus and a medical apparatus.

As illustrated in FIG. 1 or 4, the electronic device 1000 includes a high-voltage power supply module 100, a TWT 200, a heat sink 300, a first fan unit 400, a second fan unit 500, a control module 600, an inlet 700, an outlet 800, and an electronic component housing apparatus 2000. The high-voltage power supply module 100 is a first electronic component according to the present invention. Further, the TWT 200 is a second electronic component according to the present invention.

A passive element such as a resistor, a capacitor, or a piezoelectric element may be provided as a first component in place of the high-voltage power supply module 100. Further, a cable, a connector, or the like may be provided as the first component in place of the high-voltage power supply module 100.

For convenience of description, a configuration of the electronic component housing apparatus 2000 will be described first.

As illustrated in FIGS. 1 and 5, the electronic component housing apparatus 2000 includes a case 2100, a first base plate 2300, a second base plate 2400, a first partition plate 2500, and a second partition plate 2600.

As illustrated in FIGS. 1 and 4, the case 2100 houses the high-voltage power supply module 100, the TWT 200, the heat sink 300, the first fan unit 400, the second fan unit 500, and the control module 600. For example, strength, a weight, and a heat radiation property of the case 2100, and influence of magnetism on the TWT 200 are considered in selection of a material of the case 2100. For example, metal such as aluminum is used as the material of the case 2100. A heat conductivity of aluminum is approximately 236 (W/mK), which is high compared with a heat conductivity (84 [W/mK]) of iron. Thus, by using a material having heat conductivity for the case 2100, heat conduction is generated inside the case 2100 itself. Consequently, a transport path of heat energy is generated inside the case 2100 itself.

As illustrated in FIGS. 1, 2, 3, and 5, the case 2100 is formed in a box shape. The case 2100 includes a front plate 2110, a back plate 2120, a body part 2130, and an upper cover 2140.

The front plate 2110 is formed in a plate shape. The front plate 2110 is mounted on the body part 2130 by welding, screwing, or the like. As illustrated in FIG. 2, a pair of handles 2111 are mounted on the front plate 2110. Further, an open window 2112 is formed on the front plate 2110. For example, a liquid crystal panel (unillustrated) being a display screen indicating a control state of the control module 600 is mounted on the open window 2112.

The back plate 2120 is formed in a plate shape. The back plate 2120 is mounted on the body part 2130 by welding, screwing, or the like. The inlet 700 and the outlet 800 are formed on the back plate 2120. As illustrated in FIGS. 3 and 4, the second fan unit 500 is mounted on the inlet 700. Further, as illustrated in FIG. 3, a waveguide 900 is mounted on the back plate 2120.

The body part 2130 is formed in a "U" shape at a section obtained by cutting the case 2100 by a plane perpendicular to an extending direction of the first partition plate 2500 and the second partition plate 2600. The body part 2130 includes the aforementioned first bottom face 2300 and the second bottom face 2400. The front plate 2110 and the back plate 2120 are mounted on the body part 2130 by welding, screwing, or the like.

The upper cover 2140 is formed in a plate shape. From the upper side, the upper cover 2140 is put on the body part 2130 on which the front plate 2110 and the back plate 2120 are mounted. Then, the upper cover 2140 is mounted on the front plate 2110, the back plate 2120, and the body part 2130 by screwing or the like. Consequently, the inner part of the case 2100 is closed.

As illustrated in FIGS. 1, 4, and 5, the inner part of the case 2100 is separated into a first electronic component housing chamber 5000 and a second electronic component housing chamber 6000 by the first partition plate 2500 and the second partition plate 2600.

The first electronic component housing chamber 5000 houses at least the high-voltage power supply module 100. The second electronic component housing chamber 6000 houses at least the TWT 200. Further, a communicating part 7000 is provided between the first electronic component housing chamber 5000 and the second electronic component housing chamber 6000. The communicating part 7000 causes the first electronic component housing chamber 5000 and the second electronic component housing chamber 6000 to communicate with one another. Consequently, the air is able to come and go between the first electronic component housing chamber 5000 and the second electronic component housing chamber 6000 through the communicating part 7000.

Note that the communicating part 7000 may not be provided.

The first base plate 2300 is formed on the body part 2130. In other words, the first base plate 2300 is part of the case 2100. Further, as illustrated in FIGS. 1 and 4, the high-voltage power supply module 100 is installed on the first base plate 2300 and is thermally connected to the first base plate 2300. Consequently, heat of the high-voltage power supply module 100 is transferred to the first base plate 2300.

The second base plate 2400 is formed on the body part 2130. In other words, the second base plate 2400 is part of the case 2100. Further, as illustrated in FIGS. 1 and 4, the TWT 200 is installed on the second base plate 2400 and is thermally connected to the second base plate 2400. Consequently, heat of the TWT 200 is transferred to the second base plate 2400.

The first partition plate 2500 is mounted on the body part 2130. In other words, the first partition plate 2500 is part of the case 2100. More specifically, as illustrated in FIG. 1, the first partition plate 2500 is mounted on the first base plate 2300. Further, the first partition plate 2500 is thermally connected to the first base plate 2300. As illustrated in FIGS. 1 and 4, the first partition plate 2500 is arranged between the first electronic component housing chamber 5000 and the second electronic component housing chamber 6000, on the first electronic component housing chamber 5000 side.

The second partition plate 2600 is mounted on the body part 2130. In other words, the second partition plate 2600 is part of the case 2100. More specifically, as illustrated in FIG. 1, the second partition plate 2600 is mounted on the second base plate 2400. Further, the second partition plate 2600 is thermally connected to the second base plate 2400. As illustrated in FIGS. 1 and 4, the second partition plate 2600 is arranged between the first electronic component housing chamber 5000 and the second electronic component housing chamber 6000, on the second electronic component housing chamber 6000 side.

As illustrated in FIGS. 1 and 4, the first partition plate 2500 and the second partition plate 2600 are provided in such a way to at least partially face one another. Further, a first gap part G1 is provided between the first partition plate 2500 and the second partition plate 2600. In other words, the first partition plate 2500 and the second partition plate 2600 are not thermally connected to one another directly.

Further, as illustrated in FIG. 1, a second gap part G2 is provided between the first base plate 2300 and the second base plate 2400. In other words, the first base plate 2300 and the second base plate 2400 are not thermally connected to one another directly.

The configuration of the electronic component housing apparatus 2000 has been described above.

Next, each electronic component and the like housed in the electronic component housing apparatus 2000 will be described.

As illustrated in FIGS. 1 and 4, the high-voltage power supply module 100 is housed in the first electronic component housing chamber 5000. Further, the high-voltage power supply module 100 is installed on the first base plate 2300 and is thermally connected to the first base plate 2300. The high-voltage power supply module 100 supplies power for driving electronic components such as the TWT 200, the first fan unit 400, the second fan unit 500, and the control module 600 to each electronic component. A common high-voltage power supply module 100 uses many semiconductors and therefore is provided with a certain level of countermeasures against heat.

As illustrated in FIGS. 1 and 4, the TWT 200 is housed in the second electronic component housing chamber 6000. Further, the TWT 200 is installed on the second base plate 2400 and is thermally connected to the second base plate 2400. The TWT 200 amplifies and outputs a high-frequency signal. The TWT 200 amplifies the high-frequency signal by use of an electron beam (unillustrated) emitted by an electron gun (unillustrated). Accordingly, the TWT 200 has output power and a heat quantity greater than those of other electronic components such as the high-voltage power supply module 100. In other words, the TWT 200 consumes more electric power compared with the other electronic components. Accordingly, the TWT 200 is a device having a high power density compared with the other electronic components. For example, the TWT 200 may use a high voltage of the order of kilovolts.

When semiconductors are used in a microwave module, a semiconductor output suddenly drops particularly when a frequency becomes high. Accordingly, the TWT 200 tends to be used in a microwave module particularly when handling a high-frequency signal. An electron beam may have 70 to 90% remaining energy after amplification of a high-frequency signal by use of the TWT 200. The energy is absorbed by an electrode and the like. Consequently, heat greater than the high-voltage power supply module 100 is generated in the TWT 200.

More preferably, the TWT 200 is provided close to the outlet 800. Thus, the electronic device 1000 is able to efficiently discharge the heat of the TWT 200 out of the case 2100 of the electronic component housing apparatus 2000. Consequently, an incidence of other electronic components such as the high-voltage power supply module 100 and the control module 600 being subjected to the heat of the TWT 200 can be inhibited. Accordingly, a temperature rise in the other electronic components such as the high-voltage power supply module 100 and the control module 600 can be inhibited.

As illustrated in FIGS. 1 and 4, the heat sink 300 is mounted on the TWT 200. The heat sink 300 receives the heat of the TWT 200 and radiates the heat into the air.

As illustrated in FIGS. 1 and 4, the first fan unit 400 is housed in the second electronic component housing chamber 6000. As illustrated in FIGS. 1 and 4, the first fan unit 400 is provided on the front plate 2110 side. As illustrated in FIG. 4, the first fan unit 400 supplies the heat sink 300 with the air flowing into the second electronic component housing chamber 6000 from the first electronic component housing chamber 5000 through the communicating part 7000. Consequently, the heat sink 300 receiving the heat of the TWT 200 is cooled.

As illustrated in FIGS. 1 and 4, the second fan unit 500 is mounted on the inlet 700 from outside the case 2100. The second fan unit 500 facilitates the air outside the case 2100 (cooling air) flowing into the first electronic component housing chamber 5000 in the case 2100.

As illustrated in FIGS. 1 and 4, the control module 600 is mounted on the front plate 2110 from inside the case 2100. The control module 600 controls other electronic components.

As illustrated in FIG. 4, the inlet 700 is formed on the back plate 2120. The inlet 700 is formed on the first electronic component housing chamber 5000 side of the case 2100. The air outside the case 2100 flows into the first electronic component housing chamber 5000 in the case 2100 through the inlet 700.

As illustrated in FIG. 4, the outlet 800 is formed on the back plate 2120. The outlet 800 is formed on the second electronic component housing chamber 6000 side of the case 2100. The air inside the case 2100 flows out of the case 2100 through the outlet 800.

As illustrated in FIG. 3, the waveguide 900 is provided on the back plate. The waveguide 900 outputs a high-frequency signal amplified by the TWT 200 to outside the case 2100.

The configuration of the electronic device 1000 has been described above.

Next, an operation of the electronic device 1000 will be described.

First, when the electronic device 1000 is turned on, the high-voltage power supply module 100 supplies power to electronic components such as the TWT 200, the first fan unit 400, the second fan unit 500, and the control module 600. Consequently, the electronic components such as the TWT 200, the first fan unit 400, the second fan unit 500, and the control module 600 are activated. Then, the TWT 200, the high-voltage power supply module 100, and the like generate heat. The heat sink 300 receives and radiates the heat of the TWT 200.

The electronic device 1000 employs a cooling operation by forced air cooling of the air inside the case 2100 and a cooling operation by heat conduction of the case 2100 itself as cooling operations of the electronic components in the case 2100.

First, the cooling operation by forced air cooling of the air inside the case 2100 will be described.

As indicated by an arrow a in FIG. 4, the air outside the case 2100 flows into the case 2100 through the inlet 700 by the air blown by the second fan unit 500.

As indicated by an arrow b in FIG. 4, the air outside the case 2100 flows through the first electronic component housing chamber 5000, containing the heat of the high-voltage power supply module 100. Thus, the heat of the high-voltage power supply module 100 is cooled by the air outside the case 2100.

Next, as indicated by an arrow c in FIG. 4, the air flowing through the first electronic component housing chamber 5000 flows into the second electronic component housing chamber 6000 through the communicating part 7000 by the air blown by the first fan unit 400.

Next, as indicated by an arrow d in FIG. 4, the air flowing through the communicating part 7000 flows to the heat sink 300 by the air blown by the first fan unit 400. As described above, the heat sink 300 receives and radiates the heat of the TWT 200. By the air flowing through the communicating part 7000 flowing to the heat sink 300, the heat sink 300 is cooled. In other words, heat energy of the TWT 200 is absorbed by the air flowing through the communicating part 7000, through the heat sink 300. Consequently, the heat of the TWT 200 is efficiently radiated.

Next, as indicated by an arrow e in FIG. 4, the air passing the heat sink 300 flows toward the outlet 800, further containing the heat of the TWT 200, and is discharged out of the case 2100 as indicated by an arrow f in FIG. 4.

Thus, by the first fan unit 400 and the second fan unit 500, the air outside the case 2100 successively flows through the first electronic component housing chamber 5000 and the second electronic component housing chamber 6000 in the case 2100 and is discharged out of the case 2100. During the process, the air flowing in the case 2100 flows to the outlet 800, containing the heat of the high-voltage power supply module 100 and the TWT 200. Consequently, the heat of the high-voltage power supply module 100 and the TWT 200 can be discharged out of the case 2100.

The cooling operation by forced air cooling of the air inside the case 2100 has been described above.

Next, the cooling operation by heat conduction of the case 2100 itself will be described.

The high-voltage power supply module 100 is installed on the first base plate 2300. Accordingly, the heat of the high-voltage power supply module 100 is transferred to the first base plate 2300. In other words, the first base plate 2300 is subjected to heat energy of the high-voltage power supply module 100. Further, the heat of the high-voltage power supply module 100 is also transferred to the first partition plate 2500 through the first base plate 2300. Consequently, the heat of the high-voltage power supply module 100 is cooled by heat reception by the first base plate 2300 and the first partition plate 2500.

Further, the TWT 200 is installed on the second base plate 2400. Accordingly, the heat of the TWT 200 is transferred to the second base plate 2400. In other words, the second base plate 2400 is subjected to heat energy of the TWT 200. Further, the heat of the TWT 200 is also transferred to the second partition plate 2600 through the second base plate 2400. Consequently, the heat of the TWT 200 is cooled by heat reception by the second base plate 2400 and the second partition plate 2600.

Further, the heat of the high-voltage power supply module 100 is transferred to the first partition plate 2500 through the air inside the first electronic component housing chamber 5000. Consequently, the heat of the high-voltage power supply module 100 is cooled by heat reception by the first partition plate 2500. Similarly, the heat of the TWT 200 is transferred to the second partition plate 2600 through the air inside the second electronic component housing chamber 6000. Consequently, the heat of the TWT 200 is cooled by heat reception by the second partition plate 2600.

The cooling operation by heat conduction of the case 2100 itself has been described above.

At this time, as illustrated in FIG. 1, the first gap part G1 is provided between the first partition plate 2500 and the second partition plate 2600. In other words, the first partition plate 2500 and the second partition plate 2600 are separated from one another. Consequently, direct heat conduction between the first partition plate 2500 and the second partition plate 2600 does not occur. In other words, direct transport of heat energy by heat conduction inside the first partition plate 2500 and the second partition plate 2600 does not occur between the first partition plate 2500 and the second partition plate 2600. In other words, by providing the first gap part G1 between the first partition plate 2500 and the second partition plate 2600, heat transfer between the first electronic component housing chamber 5000 and the second electronic component housing chamber 6000 can be inhibited. Accordingly, an incidence of the high-voltage power supply module 100 being subjected to the heat of the TWT 200 having a heat quantity greater than that of the high-voltage power supply module 100 through the first partition plate 2500 and the second partition plate 2600 can be inhibited. Consequently, a temperature rise of the high-voltage power supply module 100 by the heat of the TWT 200 can be inhibited. Accordingly, performance degradation of the high-voltage power supply 100 by the heat of the TWT 200 can be inhibited.

As described above, providing the first gap part G1 enables efficient cooling of the heat of the TWT 200 and the high-voltage power supply module 100 while inhibiting an incidence of the high-voltage power supply module 100 being subjected to the heat of the TWT 200 having a heat quantity greater than that of the high-voltage power supply module 100.

Further, as illustrated in FIG. 1, the second gap part G2 is provided between the first base plate 2300 and the second base plate 2400. In other words, the first base plate 2300 and the second base plate 2400 are separated from one another. Consequently, direct heat conduction between the first base plate 2300 and the second base plate 2400 does not occur. In other words, direct transport of heat energy by heat conduction inside the first base plate 2300 and the second base plate 2400 does not occur between the first base plate 2300 and the second base plate 2400. In other words, the high-voltage power supply module 100 is not subjected to the heat of the TWT 200 having a heat quantity greater than that of the high-voltage power supply module 100 through the first base plate 2300 and the second base plate 2400. Accordingly, an incidence of the high-voltage power supply module 100 being subjected to the heat of the TWT 200 having a heat quantity greater than that of the high-voltage power supply module 100 can be inhibited. Consequently, a temperature rise of the high-voltage power supply module 100 by the heat of the TWT 200 can be inhibited. Accordingly, performance degradation of the high-voltage power supply 100 by the heat of the TWT 200 can be inhibited.

As described above, providing the second gap part G2 enables efficient cooling of the heat of the high-voltage power supply module 100 and the TWT 200 while inhibiting an incidence of the high-voltage power supply module 100 being subjected to the heat of the TWT 200 having a heat quantity greater than that of the high-voltage power supply module 100.

Furthermore, the first gap part G1 and the second gap part G2 communicate with one another. Consequently, direct heat conduction between the first base plate 2300 and the second partition plate 2600 does not occur. In other words, direct transport of heat energy by heat conduction inside the first base plate 2300 and the second partition plate 2600 does not occur between the first base plate 2300 and the second partition plate 2600. In other words, the high-voltage power supply module 100 is not subjected to the heat of the TWT 200 having a heat quantity greater than that of the high-voltage power supply module 100 through the first base plate 2300 and the second partition plate 2600. Further, direct heat conduction between the second base plate 2400 and the first partition plate 2500 does not occur. In other words, direct transport of heat energy by heat conduction inside the second base plate 2400 and the first partition plate 2500 does not occur between the second base plate 2400 and the first partition plate 2500. In other words, the high-voltage power supply module 100 is not subjected to the heat of the TWT 200 having a heat quantity greater than that of the high-voltage power supply module 100 through the second base plate 2400 and the first partition plate 2500. Accordingly, an incidence of the high-voltage power supply module 100 being subjected to the heat of the TWT 200 having a heat quantity greater than that of the high-voltage power supply module 100 can be inhibited. Consequently, a temperature rise of the high-voltage power supply module 100 by the heat of the TWT 200 can be inhibited. Accordingly, performance degradation of the high-voltage power supply 100 by the heat of the TWT 200 can be inhibited.

As described above, causing the first gap part G1 and the second gap part G2 to communicate with one another enables efficient cooling of the heat of the TWT 200 and the high-voltage power supply module 100 while inhibiting an incidence of the high-voltage power supply module 100 being subjected to the heat of the TWT 200 having a heat quantity greater than that of the high-voltage power supply module 100.

As described above, the electronic component housing apparatus 2000 according to the first exemplary embodiment of the present invention includes the case 2100, the first electronic component housing chamber 5000, the second electronic component housing chamber 6000, the first partition plate 2500, and the second partition plate 2600.

The case 2100 houses the high-voltage power supply module 100 (first electronic component) and the TWT 200 (second electronic component) having a heat quantity greater than that of the high-voltage power supply module 100. The first electronic component housing chamber 5000 houses the high-voltage power supply module 100. The second electronic component housing chamber 6000 houses the TWT 200.

The first partition plate 2500 is arranged between the first electronic component housing chamber 5000 and the second electronic component housing chamber 6000, on the first electronic component housing chamber 5000 side. The second partition plate 2600 is arranged between the first electronic component housing chamber 5000 and the second electronic component housing chamber 6000, on the second electronic component housing chamber 6000 side.

Then, the first partition plate 2500 and the second partition plate 2600 are provided in such a way to at least partially face one another. Further, the first gap part G1 is provided between the first partition plate 2500 and the second partition plate 2600.

Thus, the electronic component housing apparatus 2000 separates the case 2100 into the first electronic component housing chamber 5000 and the second electronic component housing chamber 6000 by use of the first partition plate 2500 and the second partition plate 2600. The first electronic component housing chamber 5000 houses the high-voltage power supply module 100. The second electronic component housing chamber 6000 houses the TWT 200. In other words, by providing the first partition plate 2500 and the second partition plate 2600, the electronic component housing apparatus 2000 houses the high-voltage power supply module 100 and the TWT 200 in separate housing chambers, respectively. Consequently, an incidence of the high-voltage power supply module 100 being subjected to the heat of the TWT 200 through the air inside the case 2100 can be inhibited.

Further, the first gap part G1 is provided between the first partition plate 2500 and the second partition plate 2600. In other words, the first partition plate 2500 and the second partition plate 2600 are separated from one another. Consequently, direct heat conduction between the first partition plate 2500 and the second partition plate 2600 does not occur. In other words, by providing the first gap part G1 between the first partition plate 2500 and the second partition plate 2600, direct transfer of heat between the first electronic component housing chamber 5000 and the second electronic component housing chamber 6000 can be inhibited. Accordingly, an incidence of the high-voltage power supply module 100 being subjected to the heat of the TWT 200 having a heat quantity greater than that of the high-voltage power supply module 100 through the first partition plate 2500 and the second partition plate 2600 can be inhibited. Consequently, a temperature rise of the high-voltage power supply module 100 by the heat of the TWT 200 can be inhibited.

As described above, providing the first gap part G1 enables efficient cooling of the heat of the TWT 200 while inhibiting an incidence of the high-voltage power supply module 100 being subjected to the heat of the TWT 200 having a heat quantity greater than that of the high-voltage power supply module 100.

Further, the electronic component housing apparatus 2000 according to the first exemplary embodiment of the present invention includes the first base plate 2300 and the second base plate 2400. The first base plate 2300 is part of the case 2100 and is thermally connected to the high-voltage power supply module 100, the high-voltage power supply module 100 (first electronic component) being installed on the plate. The second base plate 2400 is part of the case 2100 and is thermally connected to the TWT 200, the TWT 200 (second electronic component) being installed on the plate.

Then, the first base plate 2300 and the second base plate 2400 are provided in such a way to at least partially face one another. Further, the second gap part G2 is provided between the first base plate 2300 and the second base plate 2400. The first partition plate 2500 is connected to the first base plate 2300, and the second partition plate 2600 is connected to the second base plate 2400. The first gap part G1 and the second gap part G2 communicate with one another.

Thus, the high-voltage power supply module 100 is installed on the first base plate 2300 in the electronic component housing apparatus 2000. The first base plate 2300 is thermally connected to the high-voltage power supply module 100. The TWT 200 is installed on the second base plate 2400. The second base plate 2400 is thermally connected to the TWT 200. Further, the first partition plate 2500 is connected to the first base plate 2300, and the second partition plate 2600 is connected to the second base plate 2400. Accordingly, the heat of the high-voltage power supply module 100 is transferred to the first base plate 2300 and the first partition plate 2500. The heat of the TWT 200 is transferred to the second base plate 2400 and the second partition plate 2600. On the other hand, the second gap part G2 is provided between the first base plate 2300 and the second base plate 2400. In other words, the first base plate 2300 and the second base plate 2400 are separated from one another. Consequently, direct heat conduction between the first base plate 2300 and the second base plate 2400 does not occur. In other words, the high-voltage power supply module 100 is not subjected to the heat of the TWT 200 having a heat quantity greater than that of the high-voltage power supply module 100 through the first base plate 2300 and the second base plate 2400.

Further, the first gap part G1 and the second gap part G2 communicate with one another. Consequently, direct heat conduction between the first base plate 2300 and the second partition plate 2600 does not occur. In other words, direct transport of heat energy by heat conduction inside the first base plate 2300 and the second partition plate 2600 does not occur between the first base plate 2300 and the second partition plate 2600. In other words, the high-voltage power supply module 100 is not subjected to the heat of the TWT 200 having a heat quantity greater than that of the high-voltage power supply module 100 through the first base plate 2300 and the second partition plate 2600. Further, direct heat conduction between the second base plate 2400 and the first partition plate 2500 does not occur. In other words, direct transport of heat energy by heat conduction inside the second base plate 2400 and the first partition plate 2500 does not occur between the second base plate 2400 and the first partition plate 2500. In other words, the high-voltage power supply module 100 is not subjected to the heat of the TWT 200 having a heat quantity greater than that of the high-voltage power supply module 100 through the second base plate 2400 and the first partition plate 2500.

Accordingly, an incidence of the high-voltage power supply module 100 being subjected to the heat of the TWT 200 having a heat quantity greater than that of the high-voltage power supply module 100 can be inhibited. Consequently, a temperature rise of the high-voltage power supply module 100 by the heat of the TWT 200 can be inhibited. Accordingly, performance degradation of the high-voltage power supply 100 by the heat of the TWT 200 can be inhibited.

As described above, further providing the second gap part G2 and causing the first gap part G1 and the second gap part G2 to communicate with one another enable more efficient cooling of the heat of the TWT 200 while more efficiently inhibiting an incidence of the high-voltage power supply module 100 being subjected to the heat of the TWT 200 having a heat quantity greater than that of the high-voltage power supply module 100.

Further, the electronic component housing apparatus 2000 according to the first exemplary embodiment of the present invention includes the communicating part 7000. The communicating part 7000 causes the first electronic component housing chamber 5000 and the second electronic component housing chamber 6000 to communicate with one another. Further, a flow path of air flowing from the first electronic component housing chamber 5000 to the second electronic component housing chamber 6000 through the communicating part 7000 is formed.

Thus, the electronic component housing apparatus 2000 separates the case 2100 into the first electronic component housing chamber 5000 and the second electronic component housing chamber 6000 by use of the first partition plate 2500 and the second partition plate 2600. Further, by providing the communicating part 7000, the first electronic component housing chamber 5000 and the second electronic component housing chamber 6000 communicate with one another. Consequently, circulation of the air inside the case 2100 is enabled between the first electronic component housing chamber 5000 and the second electronic component housing chamber 6000. Arranging the high-voltage power supply module 100 and the TWT 200 in an air circuit in the case 2100 enables efficient cooling of the high-voltage power supply module 100 and the TWT 200 by a flow of air inside the case 2100.

Further, the electronic device 1000 according to the first exemplary embodiment of the present invention includes the high-voltage power supply module 100 (first electronic component), the TWT 200 (second electronic component), the case 2100, the first electronic component housing chamber 5000, the second electronic component housing chamber 6000, the first partition plate 2500, and the second partition plate 2600. The TWT 200 has a heat quantity greater than that of the high-voltage power supply module 100.

The case 2100 houses the high-voltage power supply module 100 and the TWT 200. The first electronic component housing chamber 5000 houses the high-voltage power supply module 100. The second electronic component housing chamber 6000 houses the TWT 200.

The first partition plate 2500 is arranged between the first electronic component housing chamber 5000 and the second electronic component housing chamber 6000, on the first electronic component housing chamber 5000 side. The second partition plate 2600 is arranged between the first electronic component housing chamber 5000 and the second electronic component housing chamber 6000, on the second electronic component housing chamber 6000 side.

Then, the first partition plate 2500 and the second partition plate 2600 are provided in such a way to at least partially face one another. Further, the first gap part G1 is provided between the first partition plate 2500 and the second partition plate 2600.

Such a configuration is also able to provide an effect similar to that provided by the aforementioned electronic component housing apparatus 2000.

Further, the electronic device 1000 according to the first exemplary embodiment of the present invention includes the first base plate 2300 and the second base plate 2400. The first base plate 2300 is part of the case 2100. The high-voltage power supply module 100 (first electronic component) is installed on the first base plate 2300. The first base plate 2300 is thermally connected to the high-voltage power supply module 100. The second base plate 2400 is part of the case 2100. The TWT 200 (second electronic component) is installed on the second base plate 2400. The second base plate 2400 is thermally connected to the TWT 200.

Then, the first base plate 2300 and the second base plate 2400 are provided in such a way to at least partially face one another. Further, the second gap part G2 is provided between the first base plate 2300 and the second base plate 2400. The first partition plate 2500 is connected to the first base plate 2300. Further, the second partition plate 2600 is connected to the second base plate 2400. The first gap part G1 and the second gap part G2 communicate with one another.

Such a configuration is also able to provide an effect similar to that provided by the aforementioned electronic component housing apparatus 2000.

By providing the first partition plate 2500 and the second partition plate 2600, the electronic device 1000 and the electronic component housing apparatus 2000, according to the first exemplary embodiment of the present invention, control a flow of air inside the case 2100. Further, by providing the first gap part G1 between the first partition plate 2500 and the second partition plate 2600, direct transfer of heat between the first electronic component housing chamber 5000 and the second electronic component housing chamber 6000 can be inhibited.

Further, the electronic device 1000 and the electronic component housing apparatus 2000 thermally connects the high-voltage power supply module 100 to the first base plate 2300 and the first partition plate 2500, and thermally connects the TWT 200 to the second base plate 2400 and the second partition plate 2600. On the other hand, the first gap part G1 is provided between the first partition plate 2500 and the second partition plate 2600, and the second gap part G2 is provided between the first base plate 2300 and the second base plate 2400. Then, the first gap part G1 and the second gap part G2 communicate with one another.

Consequently, direct heat conduction between the first base plate 2300 and the second base plate 2400 does not occur, and direct heat conduction between the first partition plate 2500 and the second partition plate 2600 does not occur. Accordingly, the heat of the TWT 200 is not directly conducted to the first base plate 2300 and the first partition plate 2500. The heat of the high-voltage power supply module 100 is not directly conducted to the second base plate 2400 and the second partition plate 2600.

As described above, the electronic device 1000 and the electronic component housing apparatus 2000 are able to inhibit heat transfer between the first electronic component housing chamber 5000 and the second electronic component housing chamber 6000. Further, in the electronic device 1000 and the electronic component housing apparatus 2000, the heat of the TWT 200 is not directly conducted to the first base plate 2300 and the first partition plate 2500, and the heat of the high-voltage power supply module 100 is not directly conducted to the second base plate 2400 and the second partition plate 2600.

Accordingly, in the electronic device 1000 and the electronic component housing apparatus 2000, even a neighborhood of the first partition plate 2500 is less likely to be influenced by the heat of the TWT 200 as long as the neighborhood is within the first electronic component housing chamber 5000, compared with a case that a single partition plate is formed (e.g. PTL 2). Consequently, for example, an electronic component that tend to change a characteristic with a temperature rise may be arranged close to the first partition plate 2500 in the first electronic component housing chamber 5000, in the electronic device 1000 and the electronic component housing apparatus 2000. Thus, compared with the case that a single partition plate is formed (e.g. PTL 2), the electronic device 1000 and the electronic component housing apparatus 2000 are able to improve flexibility in layout design of electronic components.

Second Exemplary Embodiment

Figure 6:
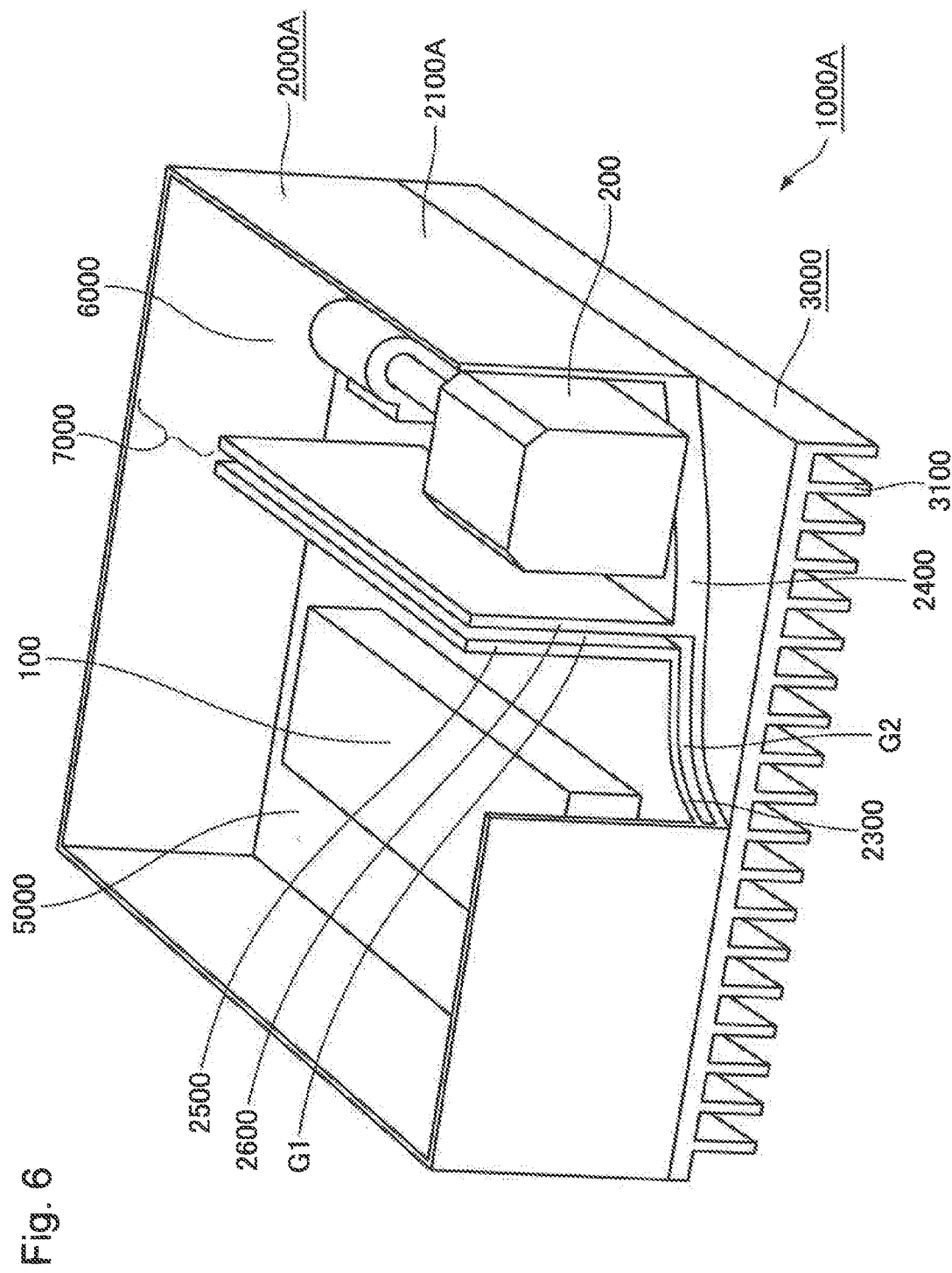
FIG. 6 is a perspective view illustrating an internal configuration of an electronic device according to a second exemplary embodiment of the present invention.

A configuration of an electronic device 1000A according to a second exemplary embodiment of the present invention will be described. FIG. 6 is a perspective view illustrating an internal configuration of the electronic device 1000A. For example, the electronic device 1000A is a microwave power module. In the following description, the electronic device 1000A will be described as a microwave power module. In FIG. 6, a reference sign equivalent to a reference sign indicated in FIGS. 1 to 5 is given to each component equivalent to that illustrated in FIGS. 1 to 5.

The electronic device 1000 according to the first exemplary embodiment and the electronic device 1000A according to the second exemplary embodiment will be compared. The electronic device 1000 supports forced air cooling. By contrast, the electronic device 1000A does not support forced air cooling. Specifically, an electronic component housing apparatus 2000A in the electronic device 1000A is a sealed case and does not take in or discharge air from or to the outside. Accordingly, the electronic device 1000A differs from the electronic device 1000 in that a first fan unit 400 and a second fan unit 500 are not provided. Further, the electronic component housing apparatus 2000A in the electronic device 1000A differs from the electronic component housing apparatus 2000 in the electronic device 1000 in not being provided with an inlet 700 and an outlet 800. While the electronic device 1000A is not provided with a heat sink 300, a control module 600, a waveguide 900, a handle 2111, an open window 2112, and the like in FIG. 6, the components may be provided.

As illustrated in FIG. 6, the electronic device 1000A includes a high-voltage power supply module 100, a TWT 200, the electronic component housing apparatus 2000A, and a heat sink 3000.

As illustrated in FIG. 6, the electronic component housing apparatus 2000A includes a case 2100A, a first base plate 2300, a second base plate 2400, a first partition plate 2500, and a second partition plate 2600.

As illustrated in FIG. 6, the case 2100A houses the high-voltage power supply module 100 and the TWT 200. For example, similarly to the case 2100, strength, a weight, and a heat radiation property of the case 2100A, and influence of magnetism on the TWT 200 are considered in selection of a material of the case 2100A. For example, metal such as aluminum is used as the material of the case 2100A.

As illustrated in FIG. 6, the case 2100A is formed in a box shape. Further, the case 2100A is formed in such a way that the inner part is sealed. Consequently, the electronic device 1000A can be installed outdoors. Note that FIG. 6 does not illustrate an upper cover. The inner part of the case 2100A is sealed by the upper cover being mounted by welding, screwing, or the like.

As illustrated in FIG. 6, similarly to the case 2100 according to the first exemplary embodiment, the inner part of the case 2100A is separated into a first electronic component housing chamber 5000 and a second electronic component housing chamber 6000 by the first partition plate 2500 and the second partition plate 2600.

The first electronic component housing chamber 5000 houses at least the high-voltage power supply module 100. The second electronic component housing chamber 6000 houses at least the TWT 200. Further, a communicating part 7000 is provided between the first electronic component housing chamber 5000 and the second electronic component housing chamber 6000. The communicating part 7000 causes the first electronic component housing chamber 5000 and the second electronic component housing chamber 6000 to communicate with one another.

Further, similarly to the electronic component housing apparatus 2000 according to the first exemplary embodiment, the first base plate 2300, the second base plate 2400, the first partition plate 2500, and the second partition plate 2600 are provided in the case 2100A.

As illustrated in FIG. 6, the heat sink 3000 is mounted on the second base plate 2400 in the case 2100A from outside the case 2100A. The heat sink 3000 includes a plurality of fins 3100. The plurality of fins 3100 are formed on the heat sink 3000 in such a way to extend in a direction perpendicular to and away from the second base plate 2400. The heat sink 3000 corresponds to a heat radiation part.

The configuration of the electronic device 1000A has been described above.

Next, an operation of the electronic device 1000A will be described.

First, when the electronic device 1000A is turned on, the high-voltage power supply module 100 supplies power to the TWT 200. Consequently, the TWT 200 is activated. Then, the TWT 200, the high-voltage power supply module 100, and the like generate heat.

The electronic device 1000A employs a cooling operation by heat conduction of the case 2100A itself as a cooling operation of electronic components in the case 2100A. The electronic device 1000A differs from the electronic device 1000 in not employing a cooling operation by forced air cooling of the air inside the case 2100A.

The cooling operation by heat conduction of the case 2100A itself in the electronic device 1000A will be described.

The high-voltage power supply module 100 is installed on the first base plate 2300. Accordingly, heat of the high-voltage power supply module 100 is transferred to the first base plate 2300. In other words, the first base plate 2300 is subjected to heat energy of the high-voltage power supply module 100. Further, the heat of the high-voltage power supply module 100 is also transferred to the first partition plate 2500 through the first base plate 2300. Thus, the heat of the high-voltage power supply module 100 is cooled by heat reception by the first base plate 2300 and the first partition plate 2500.

Further, the TWT 200 is installed on the second base plate 2400. Accordingly, heat of the TWT 200 is transferred to the second base plate 2400. In other words, the second base plate 2400 is subjected to heat energy of the TWT 200. Further, the heat of the TWT 200 is also transferred to the second partition plate 2600 through the second base plate 2400. Thus, the heat of the TWT 200 is cooled by heat reception by the second base plate 2400 and the second partition plate 2600. Additionally, the heat sink 3000 is mounted on the second base plate 2400 in the case 2100A from outside the case 2100A. Accordingly, the heat sink 3000 receives the heat of the TWT 200 through the second base plate 2400 and radiates the heat to the air outside the case 2100A.

Further, the heat of the high-voltage power supply module 100 is transferred to the first partition plate 2500 through the air inside the first electronic component housing chamber 5000. Thus, the heat of the high-voltage power supply module 100 is cooled by heat reception by the first partition plate 2500. Similarly, the heat of the TWT 200 is transferred to the second partition plate 2600 through the air inside the second electronic component housing chamber 6000. Consequently, the heat of the TWT 200 is cooled by heat reception by the second partition plate 2600.

The cooling operation by heat conduction of the case 2100A itself has been described above.

An effect of providing a first gap part G1 between the first partition plate 2500 and the second partition plate 2600 is as described in the first exemplary embodiment. Further, an effect of providing a second gap part G2 between the first base plate 2300 and the second base plate 2400 is also as described in the first exemplary embodiment. Additionally, an effect of causing the first gap part G1 and the second gap part G2 to communicate with one another is also as described in the first exemplary embodiment.

In the electronic device 1000A, the case 2100A is formed in such a way that the inner part is sealed. Further, the electronic device 1000A employs the cooling operation by heat conduction of the case 2100A itself as a cooling operation of electronic components in the case 2100A. Consequently, heat energy of the high-voltage power supply module 100 and the TWT 200 is transported to the entire case 2100A by heat conduction of the case 2100A itself. Accordingly, a temperature inside the case 2100A is likely to rise uniformly.

In the electronic device 1000A, the heat sink 3000 is thermally connected to the second base plate 2400 and radiates the heat of the TWT 200. Consequently, the heat of the TWT 200 is radiated out of the case 2100A through the heat sink 3000.

As described above, the electronic component housing apparatus 2000A and the electronic device 1000A, according to the second exemplary embodiment of the present invention, include the heat sink 3000 (heat radiation part). The heat sink 3000 is thermally connected to the second base plate 2400 and radiates the heat of the TWT 200. Consequently, the heat of the TWT 200 is radiated out of the case 2100A through the heat sink 300. Accordingly, an incidence of the voltage power supply module 100 being subjected to the heat of the TWT 200 having a heat quantity greater than that of the high-voltage power supply module 100 can be inhibited. Accordingly, a temperature rise of the high-voltage power supply module 100 by the heat of the TWT 200 can be inhibited.

As described above, providing the heat sink 3000 enables more efficient cooling of the heat of the TWT 200 while more efficiently inhibiting an incidence of the high-voltage power supply module 100 being subjected to the heat of the TWT 200 having a heat quantity greater than that of the high-voltage power supply module 100.

Next, a heat radiation simulation result of the electronic device 1000A according to the second exemplary embodiment will be described in comparison with a comparative example.

Figure 7A:
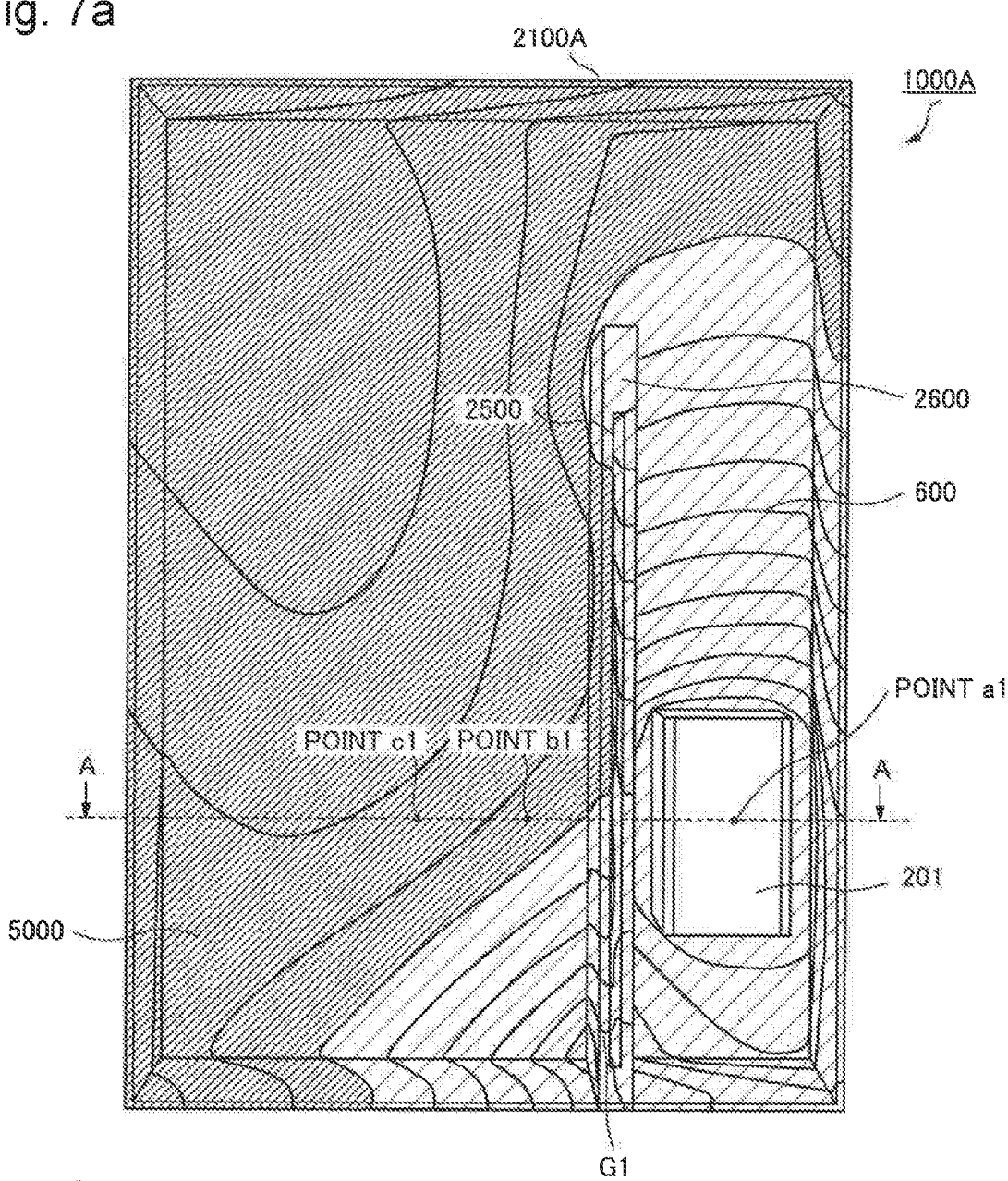
FIGS. 7a and 7b are diagrams illustrating a heat radiation simulation result of the electronic device according to the second exemplary embodiment of the present invention.
Figure 7B:
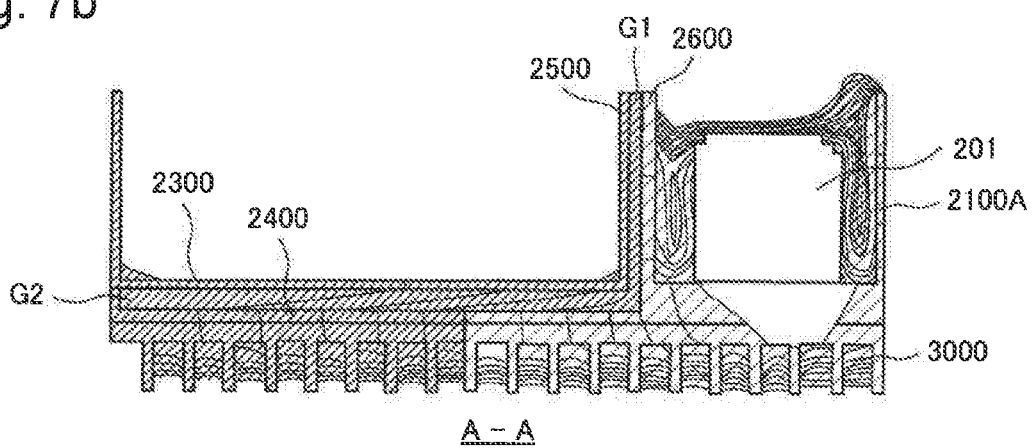

FIGS. 7a and 7b are diagrams illustrating a heat radiation simulation result of the electronic device 1000A. FIG. 7a is a top view illustrating the heat radiation simulation result of the electronic device 1000A. FIG. 7b is a cross-sectional view illustrating the heat radiation simulation result of the electronic device 1000A and is a cross-sectional view at an A-A section in FIG. 7a. FIGS. 7a and 7b illustrate temperature change gradients. In FIGS. 7a and 7b, as a temperature in an area increases, a color of the area becomes brighter. That is, the rough hatched area has a higher temperature than the finely hatched area. Further, outer dimensions of the case 2100A are set to 200 mm×300 mm×50 mm. Outer dimensions of the heat sink 3000 are set to 300 mm×200 mm×10 mm. A material of the case 2100A and the heat sink 3000 is set to an aluminum alloy.

A shape of the TWT 200 is simplified in FIGS. 7a and 7b for convenience. Further, in order to check a heat transfer path of the TWT 200, the high-voltage power supply module 100 is omitted in FIGS. 7a and 7b. Further, FIGS. 7a and 7b illustrate only a collector 201 having a particularly large heat quantity in the TWT 200, and a configuration other than the collector 201 is omitted. Further, the second gap part G2 is assumed to be provided between the first base plate 2300 and the second base plate 2400 over an entire area corresponding to the first electronic component housing chamber 5000.

Figure 8A:
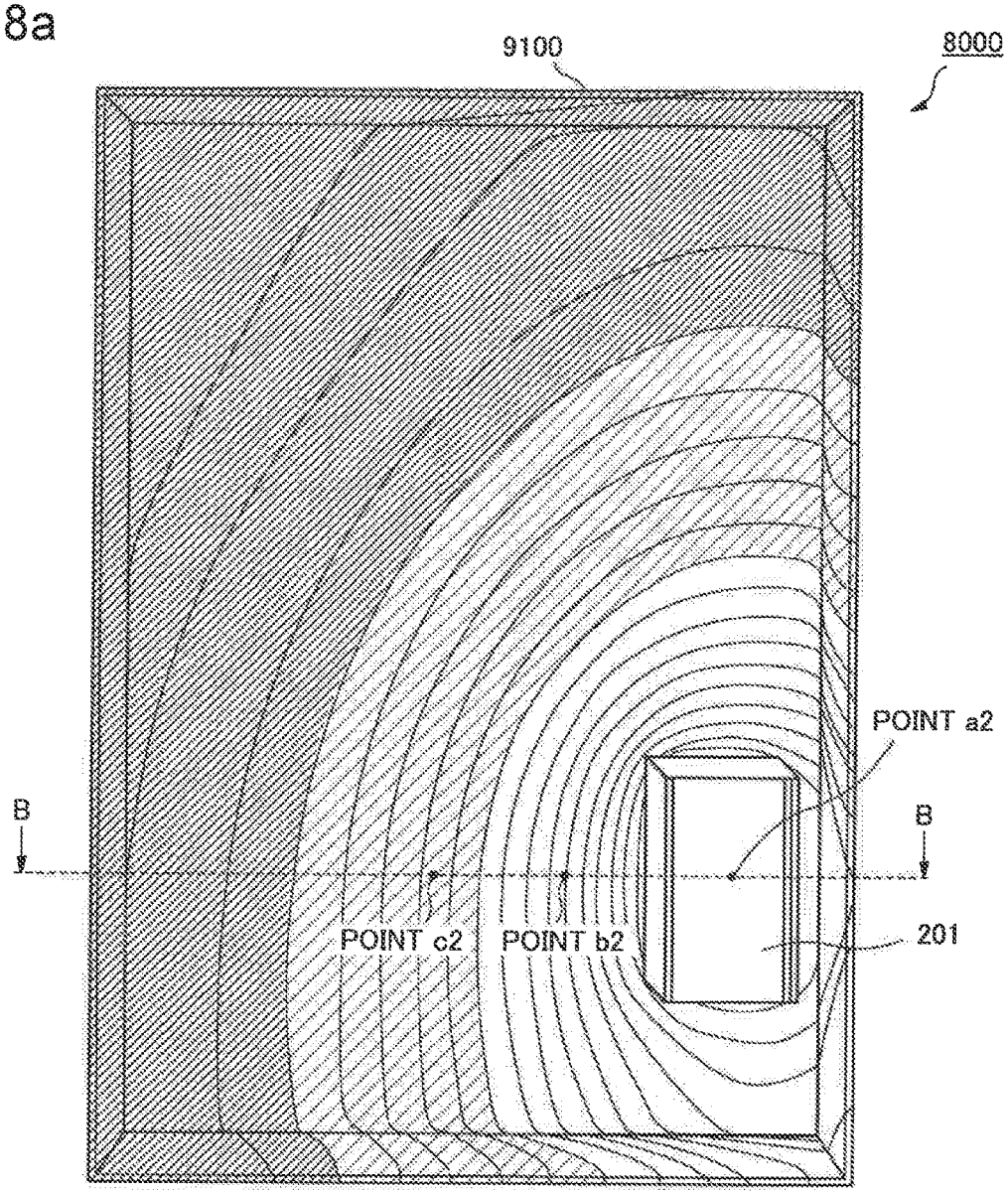
FIGS. 8a and 8b are diagrams illustrating a heat radiation simulation result of a comparative example of the electronic device according to the second exemplary embodiment of the present invention.
Figure 8B:
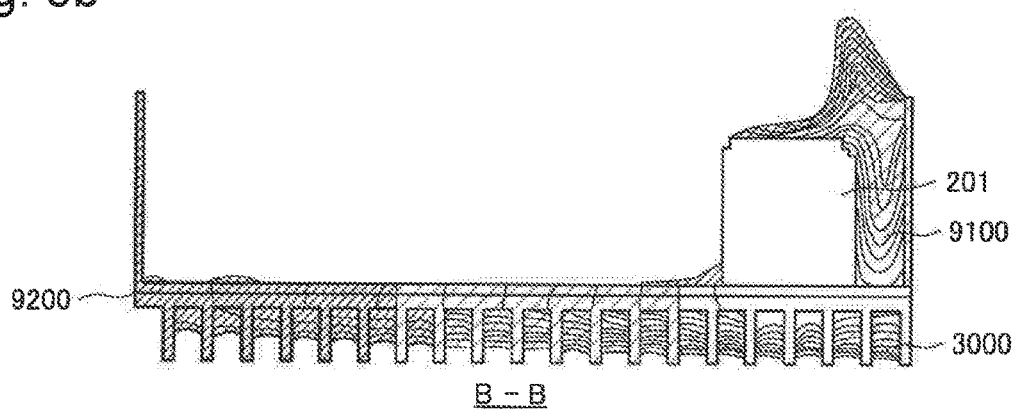

FIGS. 8a and 8b are diagrams illustrating a heat radiation simulation result of a comparative example of the electronic device 1000A. FIG. 8a is a top view illustrating the heat radiation simulation result of the comparative example of the electronic device 1000A. FIG. 8b is a cross-sectional view illustrating the heat radiation simulation result of the comparative example of the electronic device 1000A and is a cross-sectional view at a B-B section in FIG. 8a. FIGS. 8a and 8b illustrate temperature change gradients. In FIGS. 8a and 8b, as a temperature in an area increases, a color of the area becomes brighter. That is, the rough hatched area has a higher temperature than the finely hatched area. Further, outer dimensions of a case 9100 are set to 200 mm×300 mm×50 mm. Outer dimensions of the heat sink 3000 are set to 300 mm×200 mm×10 mm. A material of the case 9100 and the heat sink 3000 is set to an aluminum alloy.

The case 9100 in an electronic device 8000 in the comparative example illustrated in FIGS. 8a and 8b is not provided with a first partition plate 2500 and a second partition plate 2600. Further, a first base plate 2300 and a second base plate 2400 are not provided, and only a single base plate 9200 is provided. Dimensions of the case 9100 in the electronic device 8000 are nearly identical to the dimensions of the case 2100A in the electronic device 1000A. Further, FIGS. 8a and 8b illustrate only a collector 201 having a particularly large heat quantity in a TWT 200, and a configuration other than the collector 201 is omitted. Further, in order to check a heat transfer path of the collector 201 in the TWT 200, a high-voltage power supply module 100 is omitted in FIGS. 8a and 8b.

As illustrated in FIG. 7a, point a1 is set in a center part of the collector 201 in the TWT 200. Points b1 and c1 are provided on the section A-A extending in a direction perpendicular to the first partition plate 2500 and the second partition plate 2600. Further, the section A-A is set on point a1. Additionally, a distance between point b1 and the first partition plate 2500 is set in such a way to be less than a distance between point c1 and the first partition plate 2500. Additionally, a distance between point b1 and point a1 is set in such a way to be less than a distance between point c1 and point a1.

Let a temperature rise of the collector 201 in the TWT 200 (a temperature rise of the TWT 200 during a period from before activation to after activation [e.g. 15 minutes]) at point a1 be denoted as $\Delta Ta1$ (deg). At this time, a ratio between a temperature rise at point b1 $\Delta Tb1$ (deg) and $\Delta Ta1$ (deg) was $\Delta Tb1/\Delta Ta1=0.67$. A ratio between a temperature rise at point c1 $\Delta Tc1$ (deg) and $\Delta Ta1$ (deg) was $\Delta Tc1/\Delta Ta1=0.69$.

In FIG. 8a, points a2, b2, and c2 are set in positions corresponding to points a1, b1, and c1 in FIG. 7a, respectively. In other words, point a2 is set in the center part of the collector 201 in the TWT 200. Points b2 and c2 are provided on the section B-B. The section B-B corresponds to the section A-A in FIG. 7a. Further, the section B-B is set on point a2. Additionally, a distance between point b2 and point a2 is set in such a way to be less than a distance between point c2 and point a2.

As illustrated in FIGS. 8a and 8b, a temperature in the case 9100 decreases as a measurement point becomes distant from the collector 201 in the TWT 200. Further, as illustrated in FIG. 8a, it can be understood that a temperature change gradient near the collector 201 in the TWT 200 in the electronic device 8000 is greater compared with the electronic device 1000A. Further, let a temperature rise of the collector 201 in the TWT 200 (a temperature rise of the collector 201 in the TWT 200 during a period from before activation to after activation [e.g. 15 minutes]) at point a2 be denoted as $\Delta Ta2$ (deg). At this time, a ratio between a temperature rise at point b2 $\Delta Tb2$ (deg) and $\Delta Ta2$ (deg) was $\Delta Tb2/\Delta Ta2=0.82$. A ratio between a temperature rise at point c2 $\Delta Tc2$ (deg) and $\Delta Ta2$ (deg) was $\Delta Tc2/\Delta Ta2=0.67$.

Accordingly, it can be understood that a temperature rise of the electronic device 8000 in the comparative example is greater than that of the electronic device 1000A at point b2 (corresponding to point b1). Consequently, it can be understood that, by providing the first partition plate 2500 and the second partition plate 2600, an incidence of heat of the collector 201 in the TWT 200 being transferred to the first electronic component housing chamber 5000 housing the high-voltage power supply module 100 can be inhibited in the electronic device 1000A. Further, it can be understood that transport of heat energy of the collector 201 in the TWT 200 has certain directivity.

Analysis of FIGS. 7a, 7b, 8a, and 8b based on the above tells the following.

In the electronic device 1000A, a temperature rise at point b1 (corresponding to point b2) is small compared with that in the electronic device 8000. In other words, by providing the first partition plate 2500 and the second partition plate 2600, a temperature rise on the first electronic component housing chamber 5000 side is inhibited in the electronic device 1000A compared with the electronic device 8000, even in an area close to the collector 201 in the TWT 200. Consequently, a low-heat-resistant electronic component implemented in an area distant from the collector 201 in the TWT 200 in the electronic device 8000 can be implemented close to the collector 201 in the TWT 200 (e.g. point b1) on the first electronic component housing chamber 5000 side. Accordingly, the electronic device 1000A is able to improve flexibility in implementation design, compared with the electronic device 8000.

Next a heat radiation simulation result of the electronic device 1000A according to the second exemplary embodiment will be described in comparison with a modified example.

Figure 9A:
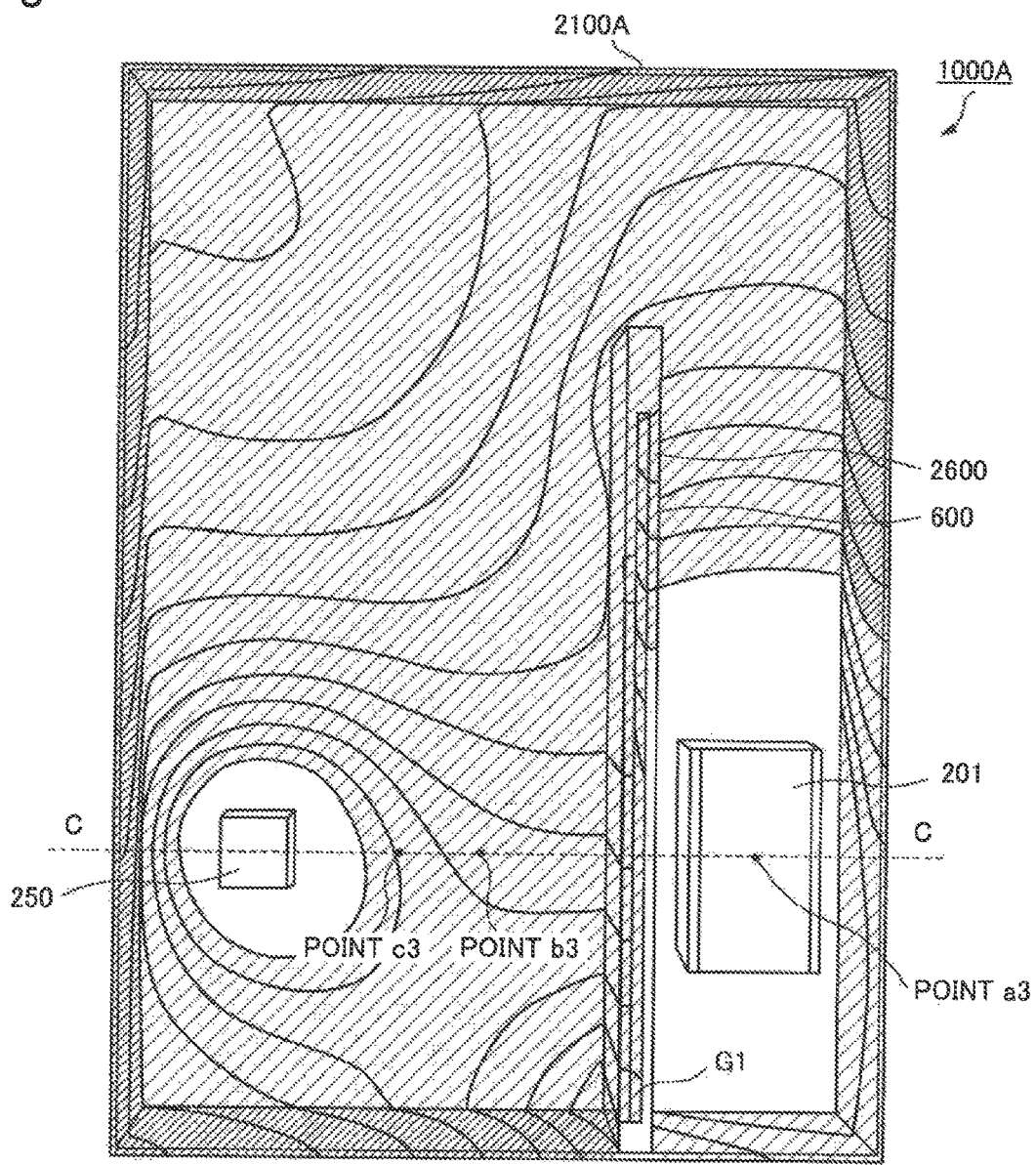
FIGS. 9a and 9b are diagrams illustrating a heat radiation simulation result of the electronic device according to the second exemplary embodiment of the present invention.
Figure 9B:
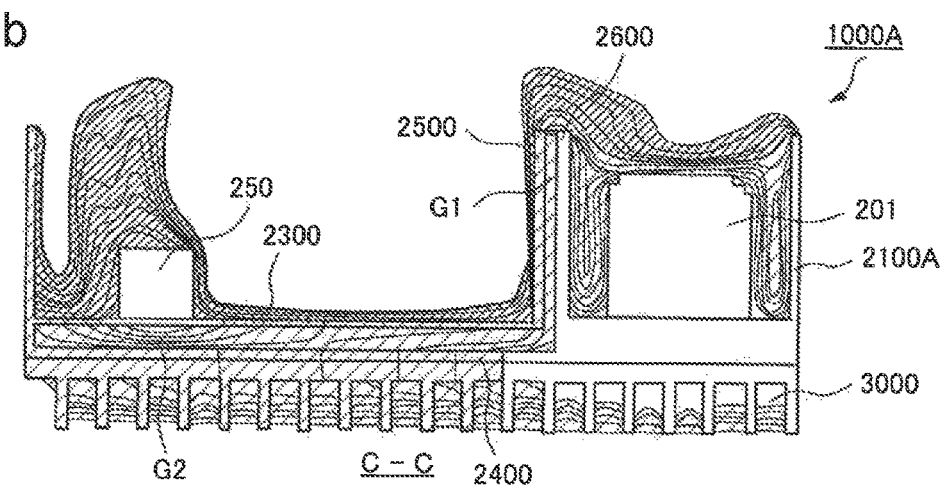

FIGS. 9a and 9b are diagrams illustrating a heat radiation simulation result of the electronic device 1000A. FIG. 9a is a top view illustrating the heat radiation simulation result of the electronic device 1000A. FIG. 9b is a cross-sectional view illustrating the heat radiation simulation result of the electronic device 1000A and is a cross-sectional view at a C-C section in FIG. 9a. FIGS. 9a and 9b illustrate temperature change gradients. In FIGS. 9a and 9b, as a temperature in an area increases, a color of the area becomes brighter. That is, the rough hatched area has a higher temperature than the finely hatched area. Further, outer dimensions of the case 2100A are set to 200 mm×300 mm×50 mm. Outer dimensions of the heat sink 3000 are set to 300 mm×200 mm×10 mm. A material of the case 2100A and the heat sink 3000 is set to an aluminum alloy.

FIG. 9a and FIG. 9b illustrate only the collector 201 having a particularly large heat quantity in the TWT 200, and a configuration other than the collector 201 is omitted. Further, in order to check a heat transfer path of the TWT 200, the high-voltage power supply module 100 is omitted in FIGS. 9a and 9b. Further, differing from FIGS. 7a and 7b, a heating element 250 is implemented in the first electronic component housing chamber 5000 in FIGS. 9a and 9b. Further, the second gap part G2 is assumed to be provided between the first base plate 2300 and the second base plate 2400 over an entire area corresponding to the first electronic component housing chamber 5000.

For example, a heat quantity of the heating element 250 is at a same level as or less than the heat quantity of the TWT 200.

Figure 10A:
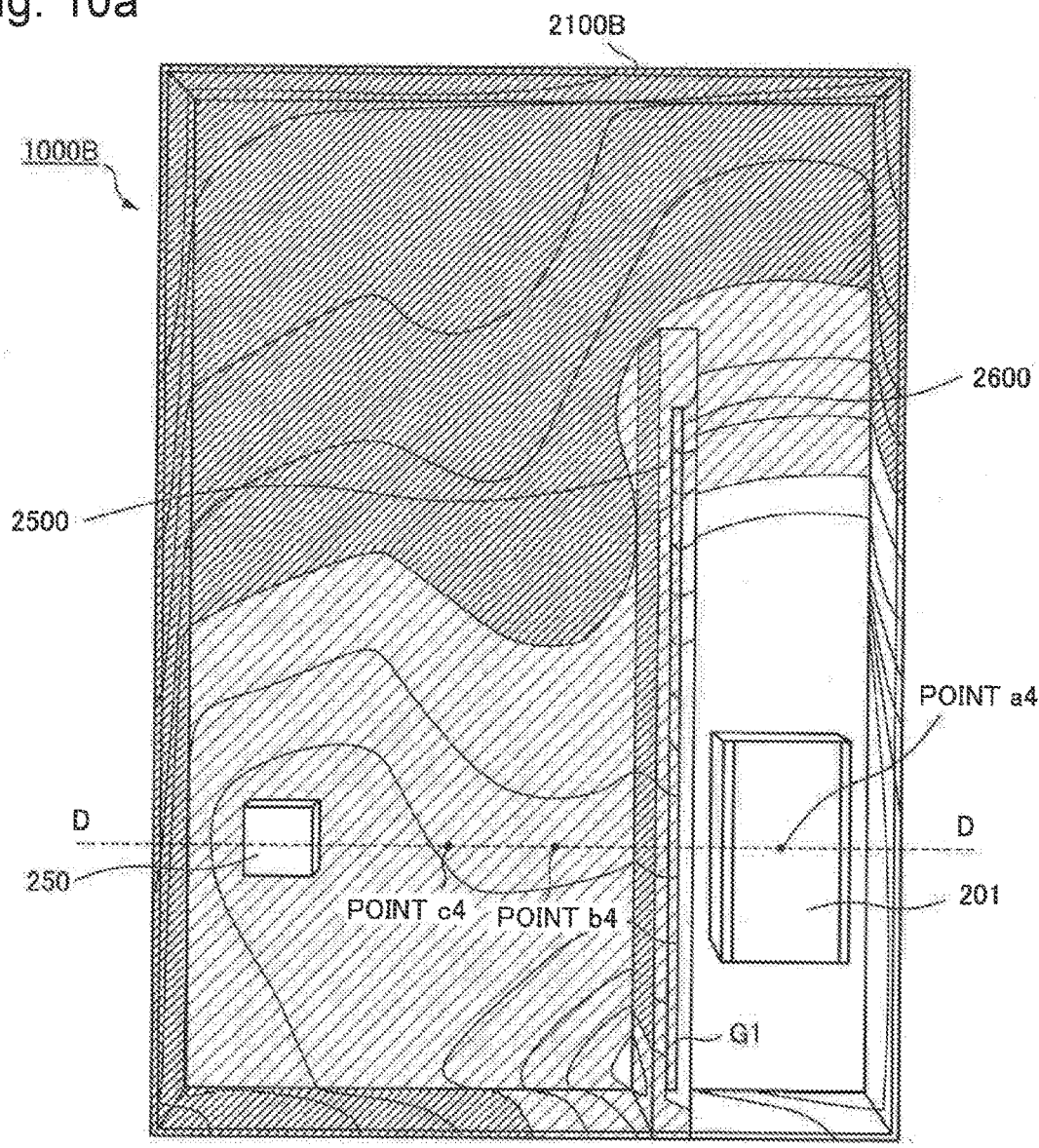
FIGS. 10a and 10b are diagrams illustrating a heat radiation simulation result of a modified example of the electronic device according to the second exemplary embodiment of the present invention.
Figure 10B:
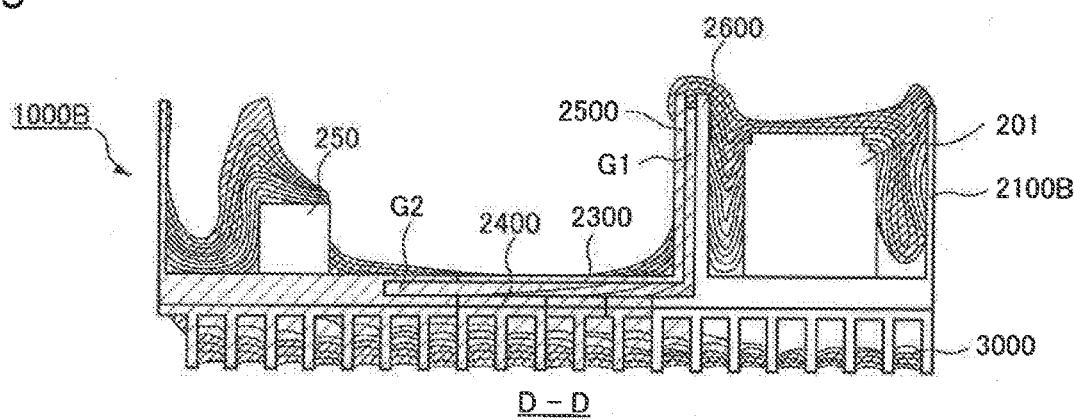

FIGS. 10a and 10b are diagrams illustrating a heat radiation simulation result of a modified example of the electronic device 1000A. FIG. 10a is a top view illustrating the heat radiation simulation result of the modified example of the electronic device 1000A. FIG. 10b is a cross-sectional view illustrating the heat radiation simulation result of the modified example of the electronic device 1000A and is a cross-sectional view at a D-D section in FIG. 10a. FIGS. 10a and 10b illustrate temperature change gradients. In FIGS. 10a and 10b, as a temperature in an area increases, a color of the area becomes brighter. That is, the rough hatched area has a higher temperature than the finely hatched area.

Further, outer dimensions of a case 2100B are set to 200 mm×300 mm×50 mm. Outer dimensions of a heat sink 3000 are set to 300 mm×200 mm×10 mm. A material of the case 2100B and the heat sink 3000 is set to an aluminum alloy.

In an electronic device 1000B in the modified example illustrated in FIGS. 10a and 10b, the case 2100B in an electronic component housing apparatus 2000B is provided with a first partition plate 2500, a second partition plate 2600, a first base plate 2300, and a second base plate 2400. On the other hand, as illustrated in FIG. 10b, the electronic device 1000B differs from the electronic device 1000A in not forming a dual structure of the first base plate 2300 and the second base plate 2400 in an implementation area of a heating element 250. Dimensions of the case 2100B in the electronic device 1000B are nearly identical to the dimensions of the electronic device 1000A.

Further, FIGS. 10a and 10b illustrate only a collector 201 having a particularly large heat quantity in a TWT 200, and a configuration other than the collector 201 is omitted. Further, in order to check a heat transfer path of the TWT 200, a high-voltage power supply module 100 is omitted in FIGS. 10a and 10b. Further, differing from FIGS. 7a and 7b, the heating element 250 is implemented in a first electronic component housing chamber 5000 in FIGS. 10a and 10b.

As described above, for example, a heat quantity of the heating element 250 is at a same level as or less than the heat quantity of the TWT 200.

As illustrated in FIG. 9a, point a3 is set in a center part of the collector 201 in the TWT 200. Points b3 and c3 are provided on the section C-C extending in a direction perpendicular to the first partition plate 2500 and the second partition plate 2600. Further, the section C-C is set on point a3. Further, a distance between point b3 and the first partition plate 2500 is set in such a way to be less than a distance between point c3 and the first partition plate 2500. Positions of points a3, b3, and c3 correspond to the positions of points a1, b1, and c1 in FIG. 7a, respectively.

Let a temperature rise of the collector 201 in the TWT 200 (a temperature rise of the TWT 200 during a period from before activation to after activation [e.g. 15 minutes]) at point a3 be denoted as $\Delta Ta3$ (deg). At this time, a ratio between a temperature rise at point b3 $\Delta Tb3$ (deg) and $\Delta Ta3$ (deg) was $\Delta Tb3/\Delta Ta3=0.76$. A ratio between a temperature rise at point c3 $\Delta Tc3$ (deg) and $\Delta Ta3$ (deg) was $\Delta Tc3/\Delta Ta3=0.98$.

In FIG. 10a, points a4, b4, and c4 are set in positions corresponding to points a3, b3, and c3 in FIG. 9a, respectively. In other words, point a4 is set in the center part of the collector 201 in the TWT 200. Points b4 and c4 are provided on the section D-D corresponding to the section C-C in FIG. 9a. Further, the section D-D is set on point a4. Additionally, a distance between point b4 and point a4 is set in such a way to be less than a distance between point c4 and point a4.

Let a temperature rise of the collector 201 in the TWT 200 (a temperature rise of the TWT 200 during a period from before activation to after activation [e.g. 15 minutes]) at point a4 be denoted as $\Delta Ta4$ (deg). At this time, a ratio between a temperature rise at point b4 $\Delta Tb4$ (deg) and $\Delta Ta4$ (deg) was $\Delta Tb4/\Delta Ta4=0.74$. A ratio between a temperature rise at point c4 $\Delta Tc4$ (deg) and $\Delta Ta4$ (deg) was $\Delta Tc4/\Delta Ta4=0.82$.

Analysis of FIGS. 9a, 9b, 10a, and 10b based on the above tells the following.

As illustrated in FIG. 9a, a dual structure of the first base plate 2300 and the second base plate 2400 is formed in an implementation area of the heating element 250 in the electronic device 1000A, and therefore heat of the heating element 250 is not directly transferred to the heat sink 3000 side. Accordingly, a temperature at point c3 greatly rises compared with that at point c4 in FIG. 10a.

On the other hand, as illustrated in FIG. 10a, a dual structure of the first base plate 2300 and the second base plate 2400 is not formed in an implementation area of the heating element 250 in the electronic device 1000B, and therefore heat of the heating element 250 is directly transferred to the heat sink 3000 side. Consequently, a temperature rise at point c4 is kept low compared with a temperature rise at point c3 in FIG. 9a.

In other words, as illustrated in FIGS. 10a and 10b, by not forming the dual structure of the first base plate 2300 and the second base plate 2400 in the implementation area of the heating element 250, the heat of the heating element 250 can be directly transferred to the heat sink 3000 side. Consequently, a temperature of an area around the heating element 250 can be reduced, compared with the electronic device 1000A.

Thus, depending on a heat quantity of an electronic component implemented in the first electronic component housing chamber 5000, a temperature rise in an area around the electronic component can be inhibited by not forming the dual structure of the first base plate 2300 and the second base plate 2400 in an implementation area of the electronic component. Consequently, flexibility in implementation design of electronic components can be improved.

Third Exemplary Embodiment

Figure 11:
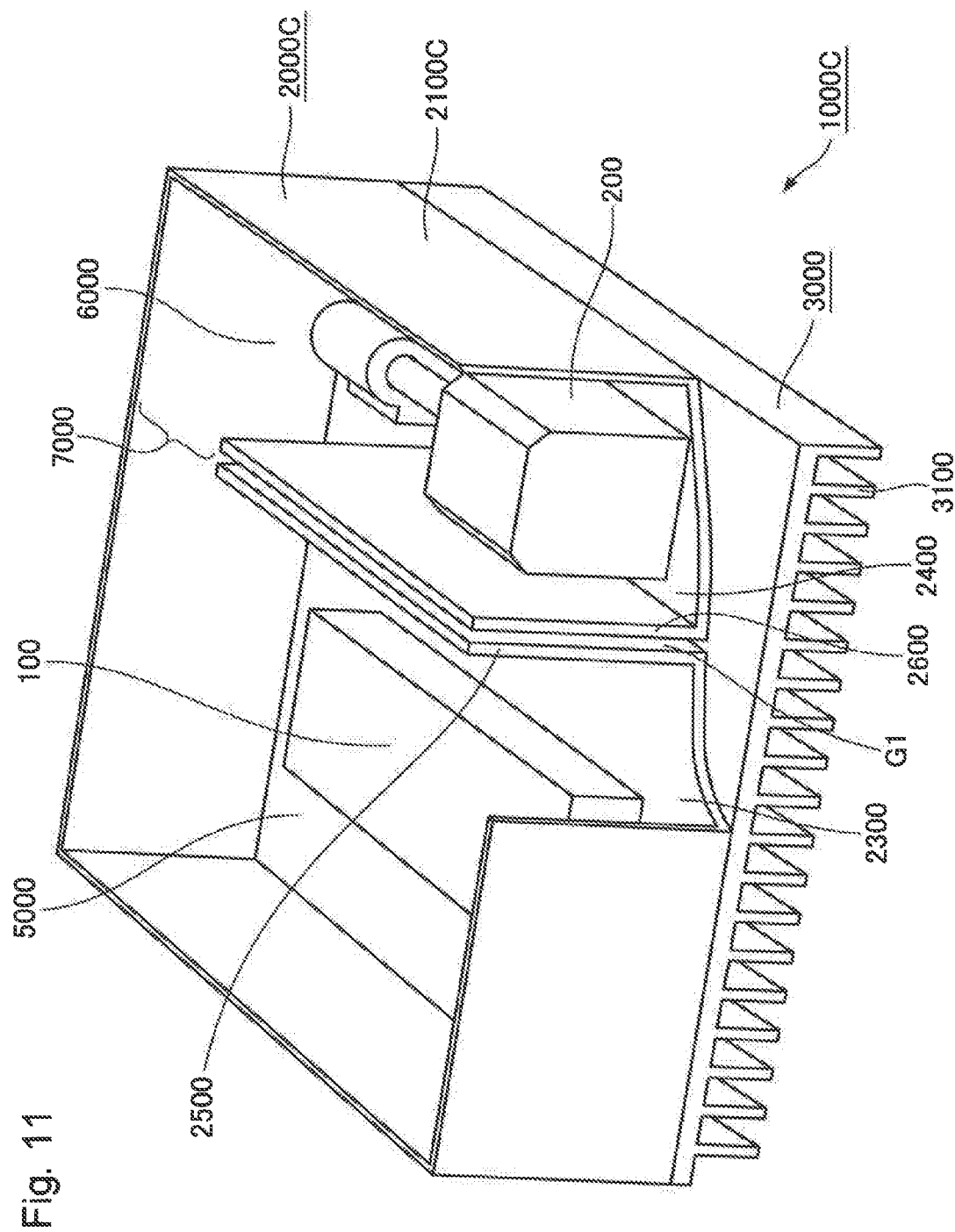
FIG. 11 is a perspective view illustrating an internal configuration of an electronic device according to a third exemplary embodiment of the present invention.

A configuration of an electronic device 1000C according to a third exemplary embodiment of the present invention will be described. FIG. 11 is a perspective view illustrating an internal configuration of the electronic device 1000C. For example, the electronic device 1000C is a microwave power module. In the following description, the electronic device 1000C will be described as a microwave power module. In FIG. 11, a reference sign equivalent to a reference sign indicated in FIGS. 1 to 10 is given to each component equivalent to that illustrated in FIGS. 1 to 10.

The electronic device 1000A according to the second exemplary embodiment and the electronic device 1000C according to the third exemplary embodiment will be compared. The electronic device 1000A and the electronic device 1000C have a point in common that neither supports forced air cooling. Specifically, an electronic component housing apparatus 2000C in the electronic device 1000C is a sealed case and does not take in or discharge air from or to the outside. Further, the electronic device 1000C differs from the electronic device 1000A in that a first base plate 2300 and a second base plate 2400 are not arranged in such a way to face one another. Accordingly, a gap part G2 is not provided between the first base plate 2300 and the second base plate 2400.

As illustrated in FIG. 11, the electronic device 1000C includes a high-voltage power supply module 100, a TWT 200, the electronic component housing apparatus 2000C, and a heat sink 3000. Note that the heat sink 3000 is not essential to the present exemplary embodiment. In other words, the electronic device 1000C according to the third exemplary embodiment may be configured without providing the heat sink 3000.

As illustrated in FIG. 11, the electronic component housing apparatus 2000C includes a case 2100C, the first base plate 2300, the second base plate 2400, a first partition plate 2500, and a second partition plate 2600.

As illustrated in FIG. 11, the case 2100C houses the high-voltage power supply module 100 and the TWT 200. For example, similarly to the case 2100, strength, a weight, and a heat radiation property of the case 2100C, and influence of magnetism on the TWT 200 are considered in selection of a material of the case 2100C. For example, metal such as aluminum is used as the material of the case 2100C.

As illustrated in FIG. 11, the case 2100C is formed in a box shape. Further, the case 2100C is formed in such a way that the inner part is sealed. Consequently, the electronic device 1000C can be installed outdoors. Note that FIG. 11 does not illustrate an upper cover. The inner part of the case 2100C is sealed by the upper cover being mounted by welding, screwing, or the like.

As illustrated in FIG. 11, similarly to the case 2100A, the inner part of the case 2100C is separated into a first electronic component housing chamber 5000 and a second electronic component housing chamber 6000 by the first partition plate 2500 and the second partition plate 2600.

The first electronic component housing chamber 5000 houses at least the high-voltage power supply module 100. The second electronic component housing chamber 6000 houses at least the TWT 200. Further, a communicating part 7000 is provided between the first electronic component housing chamber 5000 and the second electronic component housing chamber 6000. The communicating part 7000 causes the first electronic component housing chamber 5000 and the second electronic component housing chamber 6000 to communicate with one another.

Further, the first base plate 2300, the second base plate 2400, the first partition plate 2500, and the second partition plate 2600 are provided in the case 2100C. In the electronic device 1000C, the first base plate 2300 and the second base plate 2400 are not arranged in such a way to face one another. Accordingly, a gap part G2 is not provided between the first base plate 2300 and the second base plate 2400. On the other hand, the first partition plate 2500 and the second partition plate 2600 are arranged in such a way to face one another. Then, a gap part G1 is provided between the first partition plate 2500 and the second partition plate 2600.

As illustrated in FIG. 11, the heat sink 3000 is mounted on the first base plate 2300 and the second base plate 2400 in the case 2100C from outside the case 2100C.

The configuration of the electronic device 1000C has been described above.

Next, an operation of the electronic device 1000C will be described.

First, when the electronic device 1000C is turned on, the high-voltage power supply module 100 supplies power to the TWT 200. Consequently, the TWT 200 is activated. Then, the TWT 200, the high-voltage power supply module 100, and the like generate heat.

The electronic device 1000C employs a cooling operation by heat conduction of the case 2100C itself as a cooling operation of electronic components in the case 2100C.

The cooling operation by heat conduction of the case 2100C itself in the electronic device 1000C will be described.

The high-voltage power supply module 100 is installed on the first base plate 2300. Accordingly, heat of the high-voltage power supply module 100 is transferred to the first base plate 2300. In other words, the first base plate 2300 is subjected to heat energy of the high-voltage power supply module 100. Further, the heat of the high-voltage power supply module 100 is also transferred to the first partition plate 2500 through the first base plate 2300. Consequently, the heat of the high-voltage power supply module 100 is cooled by heat reception by the first base plate 2300 and the first partition plate 2500.

Further, the TWT 200 is installed on the second base plate 2400. Accordingly, heat of the TWT 200 is transferred to the second base plate 2400. In other words, the second base plate 2400 is subjected to heat energy of the TWT 200. Further, the heat of the TWT 200 is also transferred to the second partition plate 2600 through the second base plate 2400. Consequently, the heat of the TWT 200 is cooled by heat reception by the second base plate 2400 and the second partition plate 2600.

Furthermore, the heat sink 3000 is mounted on the first base plate 2300 and the second base plate 2400 in the case 2100C from outside the case 2100C. Accordingly, the heat sink 3000 receives the heat of the TWT 200 through the second base plate 2400 and radiates the heat to the air outside the case 2100C.

Further, the heat of the high-voltage power supply module 100 is transferred to the first partition plate 2500 through the air inside the first electronic component housing chamber 5000. Consequently, the heat of the high-voltage power supply module 100 is cooled by heat reception by the first partition plate 2500. Similarly, the heat of the TWT 200 is transferred to the second partition plate 2600 through the air inside the second electronic component housing chamber 6000. Consequently, the heat of the TWT 200 is cooled by heat reception by the second partition plate 2600.

The cooling operation by heat conduction of the case 2100C itself has been described above.

At this time, as illustrated in FIG. 11, the first gap part G1 is provided between the first partition plate 2500 and the second partition plate 2600. In other words, the first partition plate 2500 and the second partition plate 2600 are separated from one another. Consequently, direct heat conduction between the first partition plate 2500 and the second partition plate 2600 does not occur. In other words, direct transport of heat energy by heat conduction inside the first partition plate 2500 and the second partition plate 2600 does not occur between the first partition plate 2500 and the second partition plate 2600. In other words, by providing the first gap part G1 between the first partition plate 2500 and the second partition plate 2600, heat transfer between the first electronic component housing chamber 5000 and the second electronic component housing chamber 6000 can be inhibited. Accordingly, an incidence of the high-voltage power supply module 100 being subjected to the heat of the TWT 200 having a heat quantity greater than that of the high-voltage power supply module 100 through the first partition plate 2500 and the second partition plate 2600 can be inhibited. Consequently, a temperature rise of the high-voltage power supply module 100 by the heat of the TWT 200 can be inhibited. Accordingly, performance degradation of the high-voltage power supply 100 by the heat of the TWT 200 can be inhibited.

Accordingly, providing the first gap part G1 enables efficient cooling of the heat of the TWT 200 and the high-voltage power supply module 100 while inhibiting an incidence of the high-voltage power supply module 100 being subjected to the heat of the TWT 200 having a heat quantity greater than that of the high-voltage power supply module 100.

As described above, the electronic component housing apparatus 2000C according to the third exemplary embodiment of the present invention includes the case 2100C, the first electronic component housing chamber 5000, the second electronic component housing chamber 6000, the first partition plate 2500, and the second partition plate 2600.

The case 2100C houses the high-voltage power supply module 100 (first electronic component) and the TWT 200 (second electronic component). The TWT 200 has a heat quantity greater than that of the high-voltage power supply module 100. The first electronic component housing chamber 5000 houses the high-voltage power supply module 100. The second electronic component housing chamber 6000 houses the TWT 200.

The first partition plate 2500 is arranged between the first electronic component housing chamber 5000 and the second electronic component housing chamber 6000, on the first electronic component housing chamber 5000 side. The second partition plate 2600 is arranged between the first electronic component housing chamber 5000 and the second electronic component housing chamber 6000, on the second electronic component housing chamber 6000 side.

Then, the first partition plate 2500 and the second partition plate 2600 are provided in such a way to at least partially face one another. Further, the first gap part G1 is provided between the first partition plate 2500 and the second partition plate 2600.

Thus, the electronic component housing apparatus 2000C separates the case 2100C into the first electronic component housing chamber 5000 and the second electronic component housing chamber 6000 by use of the first partition plate 2500 and the second partition plate 2600. The first electronic component housing chamber 5000 houses the high-voltage power supply module 100. The second electronic component housing chamber 6000 houses the TWT 200. In other words, by providing the first partition plate 2500 and the second partition plate 2600, the electronic component housing apparatus 2000C houses the high-voltage power supply module 100 and the TWT 200 in separate housing chambers, respectively. Consequently, an incidence of the high-voltage power supply module 100 being subjected to the heat of the TWT 200 through the air inside the case 2100C can be inhibited.

Further, the first gap part G1 is provided between the first partition plate 2500 and the second partition plate 2600. In other words, the first partition plate 2500 and the second partition plate 2600 are separated from one another. Consequently, direct heat conduction between the first partition plate 2500 and the second partition plate 2600 does not occur. In other words, by providing the first gap part G1 between the first partition plate 2500 and the second partition plate 2600, heat transfer between the first electronic component housing chamber 5000 and the second electronic component housing chamber 6000 can be inhibited. Accordingly, an incidence of the high-voltage power supply module 100 being subjected to the heat of the TWT 200 having a heat quantity greater than that of the high-voltage power supply module 100 through the first partition plate 2500 and the second partition plate 2600 can be inhibited. Consequently, a temperature rise of the high-voltage power supply module 100 by the heat of the TWT 200 can be inhibited.

As described above, providing the first gap part G1 enables efficient cooling of the heat of the TWT 200 while inhibiting an incidence of the high-voltage power supply module 100 being subjected to the heat of the TWT 200 having a heat quantity greater than that of the high-voltage power supply module 100.

Fourth Exemplary Embodiment

Figure 12:
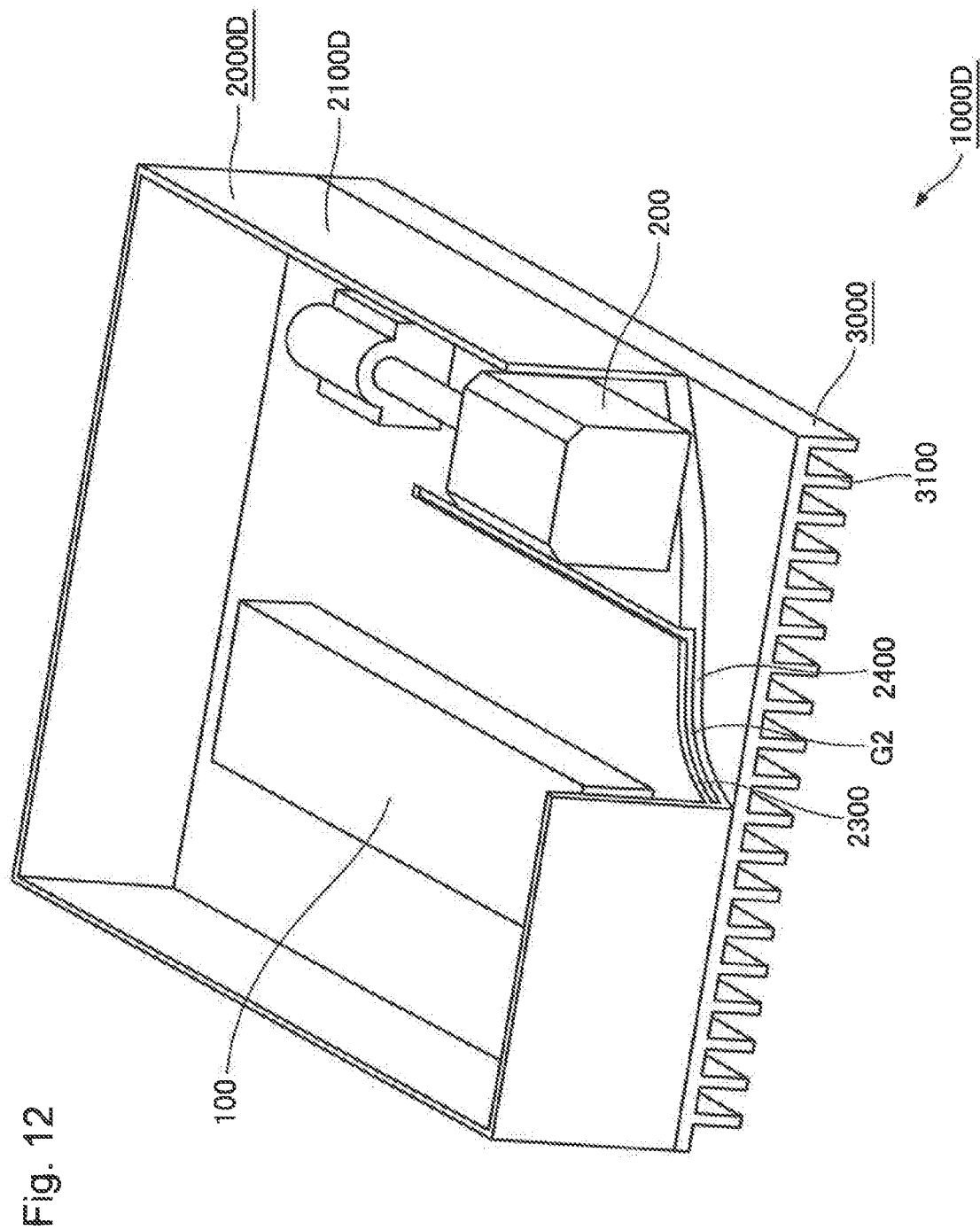
FIG. 12 is a perspective view illustrating an internal configuration of an electronic device according to a fourth exemplary embodiment of the present invention.

A configuration of an electronic device 1000D according to a fourth exemplary embodiment of the present invention will be described. FIG. 12 is a perspective view illustrating an internal configuration of the electronic device 1000D. For example, the electronic device 1000D is a microwave power module. In the following description, the electronic device 1000D will be described as a microwave power module. In FIG. 12, a reference sign equivalent to a reference sign indicated in FIGS. 1 to 11 is given to each component equivalent to that illustrated in FIGS. 1 to 11.

The electronic device 1000A according to the second exemplary embodiment and the electronic device 1000D according to the fourth exemplary embodiment will be compared. The electronic device 1000D and the electronic device 1000A have a point in common that neither supports forced air cooling. Specifically, an electronic component housing apparatus 2000D in the electronic device 1000D is a sealed case and does not take in or discharge air from or to the outside. Further, the electronic device 1000D differs from the electronic device 1000A in that a first partition plate 2500 and a second partition plate 2600 are not provided.

As illustrated in FIG. 12, the electronic device 1000D includes a high-voltage power supply module 100, a TWT 200, the electronic component housing apparatus 2000D, and a heat sink 3000. Note that the heat sink 3000 is not essential to the exemplary embodiment of the present invention. In other words, the electronic device 1000D according to the fourth exemplary embodiment may be configured without providing the heat sink 3000.

As illustrated in FIG. 12, the electronic component housing apparatus 2000D includes a case 2100D, a first base plate 2300, and a second base plate 2400.

As illustrated in FIG. 12, the case 2100D houses the high-voltage power supply module 100 and the TWT 200. For example, similarly to the case 2100, strength, a weight, and a heat radiation property of the case 2100D, and influence of magnetism on the TWT 200 are considered in selection of a material of the case 2100D. For example, metal such as aluminum is used as the material of the case 2100D.

As illustrated in FIG. 12, the case 2100D is formed in a box shape. Further, the case 2100D is formed in such a way that the inner part is sealed. Consequently, the electronic device 1000D can be installed outdoors. Note that FIG. 12 does not illustrate an upper cover. The inner part of the case 2100D is sealed by the upper cover being mounted by welding, screwing, or the like.

Further, as illustrated in FIG. 12, the first base plate 2300 and the second base plate 2400 are provided in the case 2100D. The high-voltage power supply module 100 is provided on the first base plate 2300. The TWT 200 is provided on the second base plate 2400.

As illustrated in FIG. 12, the heat sink 3000 is mounted on the second base plate 2400 in the case 2100D from outside the case 2100D.

The configuration of the electronic device 1000D has been described above.

Next, an operation of the electronic device 1000D will be described.

First, when the electronic device 1000D is turned on, the high-voltage power supply module 100 supplies power to the TWT 200. Consequently, the TWT 200 is activated. Then, the TWT 200, the high-voltage power supply module 100, and the like generate heat.

The electronic device 1000D employs a cooling operation by heat conduction of the case 2100D itself as a cooling operation of electronic components in the case 2100D.

The cooling operation by heat conduction of the case 2100D itself in the electronic device 1000D will be described.

The high-voltage power supply module 100 is installed on the first base plate 2300. Accordingly, heat of the high-voltage power supply module 100 is transferred to the first base plate 2300. In other words, the first base plate 2300 is subjected to heat energy of the high-voltage power supply module 100. Consequently the heat of the high-voltage power supply module 100 is cooled by heat reception by the first base plate 2300.

Further, the TWT 200 is installed on the second base plate 2400. Accordingly, heat of the TWT 200 is transferred to the second base plate 2400. In other words, the second base plate 2400 is subjected to heat energy of the TWT 200. Consequently, the heat of the TWT 200 is cooled by heat reception by the second base plate 2400.

Furthermore, the heat sink 3000 is mounted on the second base plate 2400 in the case 2100D from outside the case 2100D. Accordingly, the heat sink 3000 receives the heat of the TWT 200 through the second base plate 2400 and radiates the heat to the air outside the case 2100D.

The cooling operation by heat conduction of the case 2100D itself has been described above.

As illustrated in FIG. 12, a second gap part G2 is provided between the first base plate 2300 and the second base plate 2400. In other words, the first base plate 2300 and the second base plate 2400 are separated from one another in a partial area. Consequently, direct heat conduction between the first base plate 2300 and the second base plate 2400 does not occur at least in the partial area in which the first base plate 2300 and the second base plate 2400 are separated from one another. In other words, transport of heat energy by heat conduction inside the first base plate 2300 and the second base plate 2400 does not occur at least in the partial area in which the first base plate 2300 and the second base plate 2400 are separated from one another.

In other words, an incidence of the high-voltage power supply module 100 being subjected to the heat of the TWT 200 having a heat quantity greater than that of the high-voltage power supply module 100 through the first base plate 2300 and the second base plate 2400 does not occur, at least in the partial area in which the first base plate 2300 and the second base plate 2400 are separated from one another. Accordingly, an incidence of the high-voltage power supply module 100 being subjected to the heat of the TWT 200 having a heat quantity greater than that of the high-voltage power supply module 100 can be further inhibited, compared with a case that there is no area in which the first base plate 2300 and the second base plate 2400 are separated from one another. Consequently, a temperature rise of the high-voltage power supply module 100 by the heat of the TWT 200 can be inhibited. Accordingly, performance degradation of the high-voltage power supply 100 by the heat of the TWT 200 can be inhibited.

Further, the heat of the TWT 200 is not transferred to the high-voltage power supply module 100 through the first base plate 2300 and the second base plate 2400. Consequently, the heat of the TWT 200 is more likely to be transferred to the heat sink 3000 through the second base plate 2400.

As described above, providing the second gap part G2 enables efficient cooling of the heat of the high-voltage power supply module 100 and the TWT 200 while inhibiting an incidence of the high-voltage power supply module 100 being subjected to the heat of the TWT 200 having a heat quantity greater than that of the high-voltage power supply module 100.

As described above, the electronic component housing apparatus 2000D according to the fourth exemplary embodiment of the present invention includes the case 2100D, the first base plate 2300, and the second base plate 2400. The case 2100D houses the high-voltage power supply module 100 (first electronic component) and the TWT 200 (second electronic component) having a heat quantity greater than that of the high-voltage power supply module 100. The first base plate 2300 is part of the case 2100. The high-voltage power supply module 100 (first electronic component) is installed on the first base plate 2300. The first base plate 2300 is thermally connected to the high-voltage power supply module 100. The second base plate 2400 is part of the case 2100. The TWT 200 (second electronic component) is installed on the second base plate 2400. The second base plate 2400 is thermally connected to the TWT 200.

Then, the first base plate 2300 and the second base plate 2400 are provided in such a way to at least partially face one another. Further, the second gap part G2 is provided between the first base plate 2300 and the second base plate 2400.

Thus, in the electronic component housing apparatus 2000D, the high-voltage power supply module 100 is installed on the first base plate 2300. The first base plate 2300 is thermally connected to the high-voltage power supply module 100. The TWT 200 is installed on the second base plate 2400. The second base plate 2400 is thermally connected to the TWT 200. Accordingly, the heat of the high-voltage power supply module 100 is transferred to the first base plate 2300. The heat of the TWT 200 is transferred to the second base plate 2400. On the other hand, the second gap part G2 is provided between the first base plate 2300 and the second base plate 2400. In other words, the first base plate 2300 and the second base plate 2400 are separated from one another. Consequently, direct heat conduction between the first base plate 2300 and the second base plate 2400 does not occur. In other words, an incidence of the high-voltage power supply module 100 being directly subjected to the heat of the TWT 200 having a heat quantity greater than that of the high-voltage power supply module 100 through the first base plate 2300 and the second base plate 2400 does not occur.

Accordingly, an incidence of the high-voltage power supply module 100 being subjected to the heat of the TWT 200 having a heat quantity greater than that of the high-voltage power supply module 100 can be inhibited. Consequently, a temperature rise of the high-voltage power supply module 100 by the heat of the TWT 200 can be inhibited.

As described above, providing the second gap part G2 enables cooling of the heat of the high-voltage power supply module 100 and the TWT 200 while inhibiting an incidence of the high-voltage power supply module 100 being subjected to the heat of the TWT 200 having a heat quantity greater than that of the high-voltage power supply module 100.

Further, the electronic device 1000D according to the fourth exemplary embodiment of the present invention includes the high-voltage power supply module 100 (first electronic component), the TWT 200 (second electronic component), the case 2100D, the first base plate 2300, and the second base plate 2400. The TWT 200 has a heat quantity greater than that of the high-voltage power supply module 100. The case 2100D houses the high-voltage power supply module 100 and the TWT 200. The first base plate 2300 is part of the case 2100D. The high-voltage power supply module 100 is installed on the first base plate 2300. The first base plate 2300 is thermally connected to the high-voltage power supply module 100. The second base plate 2400 is part of the case 2100. The TWT 200 is installed on the second base plate 2400. The second base plate 2400 is thermally connected to the TWT 200.

Then, the first base plate 2300 and the second base plate 2400 are provided in such a way to at least partially face one another. Further, the second gap part G2 is provided between the first base plate 2300 and the second base plate 2400.

Such a configuration is also able to provide an effect similar to that provided by the aforementioned electronic component housing apparatus 2000.

According to the respective aforementioned exemplary embodiments, a heat-insulating member (unillustrated) inhibiting heat transfer inside the first gap part G1 may be provided in the first gap part G1. FIG. 13 is a diagram showing an example in which a heat-insulating member is added to the electronic device according to the first embodiment of the present invention. Thus, transfer of the heat of the TWT 200 from the second partition plate 2600 to the first partition plate 2500 through the air inside the first gap part G1 can be more effectively inhibited. Further, a heat-insulating member inhibiting heat transfer inside the second gap part G2 may be provided in the second gap part G2. FIG. 14 is a diagram showing an example in which a heat-insulating member is added to the electronic device according to the second embodiment of the present invention. Thus, transfer of the heat of the TWT 200 from the second base plate 2400 to the first base plate 2300 through the air inside the second gap part G2 can be more effectively inhibited.

Further, according to the respective aforementioned exemplary embodiments, the high-voltage power supply module 100 may be mounted on the first base plate 2300 through a seat (unillustrated). Thus, transfer of the heat of the TWT 200 to the high-voltage power supply module 100 can be further inhibited. The above is particularly effective in the case of the electronic device 1000C according to the third exemplary embodiment in which the first base plate 2300 and the second base plate 2400 are arranged in such a way not to face one another.

Further, an example of no physical connection between the first partition plate 2500 and the second partition plate 2600 has been described, according to the respective aforementioned exemplary embodiments. On the other hand, the first partition plate 2500 and the second partition plate 2600 may be physically connected as long as the first gap part G1 is provided between the first partition plate 2500 and the second partition plate 2600. Further, when the upper cover 2140 is mounted on the body part 2130, the top parts of the first partition plate 2500 and the second partition plate 2600 may be connected to the inner surface of the upper cover 2140.

Further, the respective aforementioned exemplary embodiments may be described in part or in whole as follows but are not limited thereto.

[Supplementary note 1] An electronic component housing apparatus including:
 a case housing a first electronic component and a second electronic component having a heat quantity greater than that of the first electronic component;
 a first electronic component housing chamber housing the first electronic component;
 a second electronic component housing chamber housing the second electronic component;
 a first partition plate arranged between the first electronic component housing chamber and the second electronic component housing chamber, on the first electronic component housing chamber side; and
 a second partition plate arranged between the first electronic component housing chamber and the second electronic component housing chamber, on the second electronic component housing chamber side, wherein
 the first partition plate and the second partition plate are provided in such a way to at least partially face one another, and
 a first gap part is provided between the first partition plate and a second partition plate.

[Supplementary note 2] The electronic component housing apparatus according to Supplementary note 1, further including:
 a first base plate being part of the case and being thermally connected to the first electronic component, the first electronic component being installed on the plate; and
 a second base plate being part of the case and being thermally connected to the second electronic component, the second electronic component being installed on the plate, wherein
 the first base plate and the second base plate are provided in such a way to at least partially face one another,
 a second gap part is provided between the first base plate and a second base plate,
 the first partition plate is connected to the first base plate, and the second partition plate is connected to the second base plate, and
 the first gap part and the second gap part communicate with one another.

[Supplementary note 3] The electronic component housing apparatus according to Supplementary note 2, further including
 a heat radiation part being thermally connected to the second base plate and radiating heat of the second electronic component.

[Supplementary note 4] The electronic component housing apparatus according to any one of Supplementary notes 1 to 3, further including
 a communicating part causing the first electronic component housing chamber and the second electronic component housing chamber to communicate with one another, wherein
 a flow path of air flowing from the first electronic component housing chamber to the second electronic component housing chamber through the communicating part is formed.

[Supplementary note 5] The electronic component storage apparatus according to any one of Supplementary notes 1 to 4, wherein
 a heat-insulating member inhibiting transfer of heat inside the first gap part or the second gap part is provided in the first gap part or the second gap part.

[Supplementary note 6] An electronic device including:
 a first electronic component;
 a second electronic component having a heat quantity greater than that of the first electronic component;
 a case housing a first electronic component and the second electronic component;
 a first electronic component housing chamber housing the first electronic component;
 a second electronic component housing chamber housing the second electronic component;
 a first partition plate arranged between the first electronic component housing chamber and the second electronic component housing chamber, on the first electronic component housing chamber side; and
 a second partition plate arranged between the first electronic component housing chamber and the second electronic component housing chamber, on the second electronic component housing chamber side, wherein the first partition plate and the second partition plate are provided in such a way to at least partially face one another, and a first gap part is provided between the first partition plate and a second partition plate.

[Supplementary note 7] The electronic device according to Supplementary note 6, further including:

a first base plate being part of the case and being thermally connected to the first electronic component, the first electronic component being installed on the plate; and a second base plate being part of the case and being thermally connected to the second electronic component, the second electronic component being installed on the plate, wherein the first base plate and the second base plate are provided in such a way to at least partially face one another, a second gap part is provided between the first base plate and a second base plate, the first partition plate is connected to the first base plate, and the second partition plate is connected to the second base plate, and the first gap part and the second gap part communicate with one another.

[Supplementary note 8] An electronic component housing apparatus including:

a case housing a first electronic component and a second electronic component having a heat quantity greater than that of the first electronic component;

a first base plate being part of the case and being thermally connected to the first electronic component, the first electronic component being installed on the plate; and a second base plate being part of the case and being thermally connected to the second electronic component, the second electronic component being installed on the plate, wherein the first base plate and the second base plate are provided in such a way to at least partially face one another, a second gap part is provided between the first base plate and a second base plate.

[Supplementary note 9] The electronic component housing apparatus according to Supplementary note 8, further including:

a first electronic component housing chamber housing the first electronic component;

a second electronic component housing chamber housing the second electronic component;

a first partition plate arranged between the first electronic component housing chamber and the second electronic component housing chamber, on the first electronic component housing chamber side; and a second partition plate arranged between the first electronic component housing chamber and the second electronic component housing chamber, on the second electronic component housing chamber side, wherein the first partition plate and the second partition plate are provided in such a way to at least partially face one another, a first gap part is provided between the first partition plate and a second partition plate, the first partition plate is connected to the first base plate, and the second partition plate is connected to the second base plate, and the first gap part and the second gap part communicate with one another.

[Supplementary note 10] The electronic component housing apparatus according to Supplementary note 8 or 9, further including a heat radiation part being thermally connected to the second base plate and radiating heat of the second electronic component.

[Supplementary note 11] The electronic component housing apparatus according to Supplementary note 9 or 10, further including a communicating part causing the first electronic component housing chamber and the second electronic component housing chamber to communicate with one another, wherein a flow path of air flowing from the first electronic component housing chamber to the second electronic component housing chamber through the communicating part is formed.

[Supplementary note 12] The electronic component storage apparatus according to any one of Supplementary notes 8 to 11, wherein a heat-insulating member inhibiting transfer of heat inside the first gap part or the second gap part is provided in the first gap part or the second gap part.

[Supplementary note 13] An electronic device including:

a first electronic component;

a second electronic component having a heat quantity greater than that of the first electronic component;

a case housing a first electronic component and the second electronic component;

a first base plate being part of the case and being thermally connected to the first electronic component, the first electronic component being installed on the plate; and a second base plate being part of the case and being thermally connected to the second electronic component, the second electronic component being installed on the plate, wherein the first base plate and the second base plate are provided in such a way to at least partially face one another, and a second gap part is provided between the first base plate and a second base plate.

[Supplementary note 14] The electronic component according to Supplementary note 13, further including:

a first electronic component housing chamber housing the first electronic component;

a second electronic component housing chamber housing the second electronic component;

a first partition plate arranged between the first electronic component housing chamber and the second electronic component housing chamber, on the first electronic component housing chamber side; and a second partition plate arranged between the first electronic component housing chamber and the second electronic component housing chamber, on the second electronic component housing chamber side, wherein the first partition plate and the second partition plate are provided in such a way to at least partially face one another, a first gap part is provided between the first partition plate and a second partition plate, the first partition plate is connected to the first base plate, and the second partition plate is connected to the second base plate, and the first gap part and the second gap part communicate with one another.

[Supplementary note 15] A component housing apparatus including:

a case housing a first component and a heat-generating second component;

a first component housing chamber housing the first component;

a second component housing chamber housing the second component;

a first partition plate arranged between the first component housing chamber and the second component housing chamber, on the first component housing chamber side; and a second partition plate arranged between the first electronic housing chamber and the second component housing chamber, on the second electronic housing chamber side, wherein a first gap part is provided between the first partition plate and a second partition plate.

[Supplementary note 16] The component housing apparatus according to Supplementary note 15, further including:

a first base plate being part of the case and being thermally connected to the first component, the first component being installed on the plate;

a second base plate being part of the case and being thermally connected to the second component, the second component being installed on the plate, wherein the first base plate and the second base plate are provided in such a way to at least partially face one another, a second gap part is provided between the first base plate and a second base plate, the first partition plate is connected to the first base plate, and the second partition plate is connected to the second base plate, and the first gap part and the second gap part communicate with one another.

[Supplementary note 17] The component housing apparatus according to Supplementary note 16, further including a heat radiation part thermally connected to the second base plate.

[Supplementary note 18] The component housing apparatus according to any one of Supplementary notes 15 to 17, further including a communicating part causing the first component housing chamber and the second component housing chamber to communicate with one another, wherein a flow path of air flowing from the first component housing chamber to the second component housing chamber through the communicating part is formed.

[Supplementary note 19] The component storage apparatus according to any one of Supplementary notes 15 to 18, wherein a heat-insulating member is provided in the first gap part or the second gap part.

[Supplementary note 20] A device including:

the component storage apparatus according to any one of Supplementary notes 15 to 19, a first component, and the second component.

[Supplementary note 21] A component housing apparatus including:

a case housing a first component and a heat-generating second component;

a first base plate being part of the case and being thermally connected to the first component, the first component being installed on the plate; and a second base plate being part of the case and being thermally connected to the second component, the second component being installed on the plate, wherein a second gap part is provided between the first base plate and a second base plate.

[Supplementary note 22] The component housing apparatus according to Supplementary note 21, further including;

a first electronic component housing chamber housing the first component;

a second electronic component housing chamber housing the second component;

a first partition plate arranged between the first component housing chamber and the second component housing chamber, on the first component housing chamber side; and a second partition plate arranged between the first component housing chamber and the second component housing chamber, on the second component housing chamber side, wherein a first gap part is provided between the first partition plate and a second partition plate, the first partition plate is connected to the first base plate, and the second partition plate is connected to the second base plate, and the first gap part and the second gap part communicate with one another.

[Supplementary note 23] The component housing apparatus according to Supplementary note 21 or 22, further including a heat radiation part thermally connected to the second base plate.

[Supplementary note 24] The electronic component housing apparatus according to Supplementary note 22 or 23, further including a communicating part causing the first component housing chamber and the second component housing chamber to communicate with one another, wherein a flow path of air flowing from the first component housing chamber to the second component housing chamber through the communicating part is formed.

[Supplementary note 25] The electronic component storage apparatus according to any one of Supplementary notes 21 to 24, wherein a heat-insulating member is provided in the first gap part or the second gap part.

[Supplementary note 26] A device including:

the component storage apparatus according to any one of Supplementary notes 21 to 25, the first component, and the second component.

As above, the present invention has been described based on the exemplary embodiments. An exemplary embodiment is just an illustration, and various kinds of changes, addition or subtraction and combinations may be added to each of the above-mentioned exemplary embodiments unless it deviates from the main points of the present invention. It is understood by a person skilled in the art that modification made by adding such changes, addition/subtraction and combinations are also included in the scope of the present invention.

This application claims priority based on Japanese Patent Application No. 2015-235363 filed on Dec. 2, 2015, the disclosure of which is hereby incorporated by reference thereto in its entirety.

REFERENCE SIGNS LIST

1000, 1000A, 1000B, 1000C, 1000D Electronic device
100 High-voltage power supply module
200 TWT
201 Collector
250 Heating element
300 Heat sink
400 First fan unit
500 Second fan unit
600 Control module
700 Inlet
800 Outlet
900 Waveguide 2000, 2000A, 2000B, 2000C, 2000D Electronic component housing apparatus
2100, 2100A, 2100B, 2100C, 2100D Case
2110 Front plate
2111 Handle
2112 Open window
2120 Back plate
2130 Body part
2140 Upper cover
2300 First base plate
2400 Second base plate
2500 First partition plate
2600 Second partition plate
3000 Heat sink
5000 First electronic component housing chamber
6000 Second electronic component housing chamber
7000 Communicating part
8000 Electronic device
9100 Case
9200 Base plate
G1 First gap part
G2 Second gap part

The invention claimed is:

1. An electronic component housing apparatus comprising:
   a case housing a first electronic component having a first heat quantity and a second electronic component having a second heat quantity greater than the first heat quantity of the first electronic component;
   a first electronic component housing chamber housing the first electronic component;
   a second electronic component housing chamber housing the second electronic component;
   a first partition plate arranged between the first electronic component housing chamber and the second electronic component housing chamber, on the first electronic component housing chamber side;
   a second partition plate arranged between the first electronic component housing chamber and the second electronic component housing chamber, on the second electronic component housing chamber side;
   a first base plate being part of the case and being thermally connected to the first electronic component, the first electronic component being installed on the first base plate; and
   a second base plate being part of the case and being thermally connected to the second electronic component, the second electronic component being installed on the second base plate, wherein
   the first partition plate and the second partition plate are provided in such a way as to at least partially face each other,
   a first gap part is provided between the first partition plate and the second partition plate,
   the first base plate and the second base plate are provided in such a way as to at least partially face each other,
   a second gap part is provided between the first base plate and the second base plate,
   the first partition plate is connected to the first base plate, and the second partition plate is connected to the second base plate, and
   the first gap part and the second gap part communicate with each other.

2. The electronic component housing apparatus according to claim 1, further comprising
   a communicating part causing the first electronic component housing chamber and the second electronic component housing chamber to communicate with each other, wherein
   a flow path of air flowing from the first electronic component housing chamber to the second electronic component housing chamber through the communicating part is formed.

3. The electronic component housing apparatus according to claim 1, wherein
   a heat-insulating member inhibiting transfer of heat inside the first gap part or the second gap part is provided in the first gap part or the second gap part.

4. An electronic device comprising:
   a first electronic component having a first heat quantity;
   a second electronic component having a second heat quantity greater than the first heat quantity of the first electronic component;
   a case housing the first electronic component and the second electronic component;
   a first electronic component housing chamber housing the first electronic component;
   a second electronic component housing chamber housing the second electronic component;
   a first partition plate arranged between the first electronic component housing chamber and the second electronic component housing chamber, on the first electronic component housing chamber side;
   a second partition plate arranged between the first electronic component housing chamber and the second electronic component housing chamber, on the second electronic component housing chamber side;
   a first base plate being part of the case and being thermally connected to the first electronic component, the first electronic component being installed on the first base plate; and
   a second base plate being part of the case and being thermally connected to the second electronic component, the second electronic component being installed on the second base plate, wherein
   the first partition plate and the second partition plate are provided in such a way as to at least partially face each other,
   a first gap part is provided between the first partition plate and the second partition plate,
   the first base plate and the second base plate are provided in such a way as to at least partially face each other,
   a second gap part is provided between the first base plate and the second base plate,
   the first partition plate is connected to the first base plate, and the second partition plate is connected to the second base plate, and
   the first gap part and the second gap part communicate with each other.

* * * * *